United States Patent [19]
Miki et al.

[11] Patent Number: 5,986,294
[45] Date of Patent: Nov. 16, 1999

[54] SEMICONDUCTOR INTEGRATED CIRCUIT

[75] Inventors: Tadayasu Miki, Nakakoma-gun; Shigeo Ogasawara, Higashimurayama; Noriaki Oka, Kodaira; Shigeru Takahashi, Tachikawa; Mitsuaki Katagiri, Higashimurayama, all of Japan

[73] Assignee: Hitachi, Ltd., Tokyo, Japan

[21] Appl. No.: 09/226,212

[22] Filed: Jan. 7, 1999

Related U.S. Application Data

[63] Continuation of application No. 08/838,260, Apr. 17, 1997.

[30] Foreign Application Priority Data

Apr. 17, 1996 [JP] Japan ........................ 8-94970

[51] Int. Cl.$^6$ ............................................ H01L 27/10
[52] U.S. Cl. .................. 257/203; 257/211; 257/207; 257/786
[58] Field of Search .................... 257/786, 758, 257/203, 773, 207, 208, 211, 691

[56] References Cited

U.S. PATENT DOCUMENTS

| | | | |
|---|---|---|---|
| 5,075,753 | 12/1991 | Kozono | 357/45 |
| 5,300,796 | 4/1994 | Shintani . | |
| 5,365,091 | 11/1994 | Yamagishi . | |
| 5,581,109 | 12/1996 | Hayashi et al. | 257/776 |
| 5,641,978 | 6/1997 | Jassowski . | |
| 5,659,189 | 8/1997 | Pasch . | |
| 5,892,276 | 4/1999 | Miki et al. . | |
| 5,903,019 | 5/1999 | Wantanabe . | |

FOREIGN PATENT DOCUMENTS

| | | |
|---|---|---|
| 3-173433 | 7/1991 | Japan . |
| 5-29377 | 2/1993 | Japan . |

*Primary Examiner*—Sheila V. Clark
*Attorney, Agent, or Firm*—Antonelli, Terry, Stout & Kraus, LLP

[57] ABSTRACT

A semiconductor integrated circuit having three or more layers of wiring is provided with a plurality of lines of bonding pads arranged along the outer peripheral portion of a semiconductor chip. The bonding pads on the inner line side and those on the outer line side are arranged in a zigzag manner. First outgoing wiring for electrically connecting the bonding pads on the inner line side and internal circuits (input/output buffer circuits) is formed in one layer of wiring or a plurality of layers of wiring including at least the uppermost layer of wiring, and second outgoing wiring for electrically connecting the bonding pads on the outer line side and the internal circuits (the input/output buffer circuits) is formed in a plurality of layers of wiring other than the layer in which the first outgoing wiring is formed. Further, the first outgoing wiring and the second outgoing wiring are formed in different layers of wiring and at least one of the outgoing wiring films is formed of a plurality of layers of wiring.

8 Claims, 26 Drawing Sheets

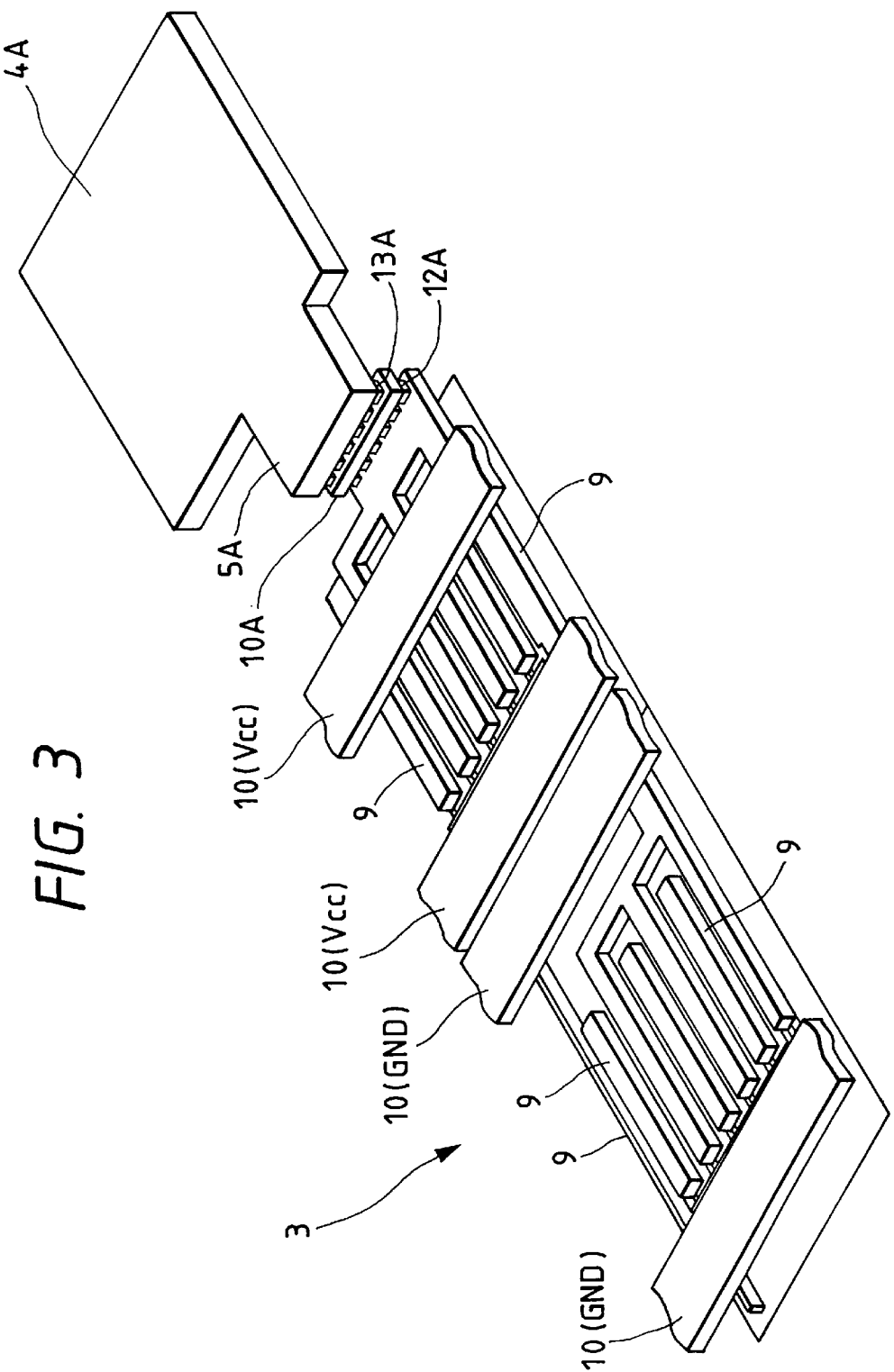

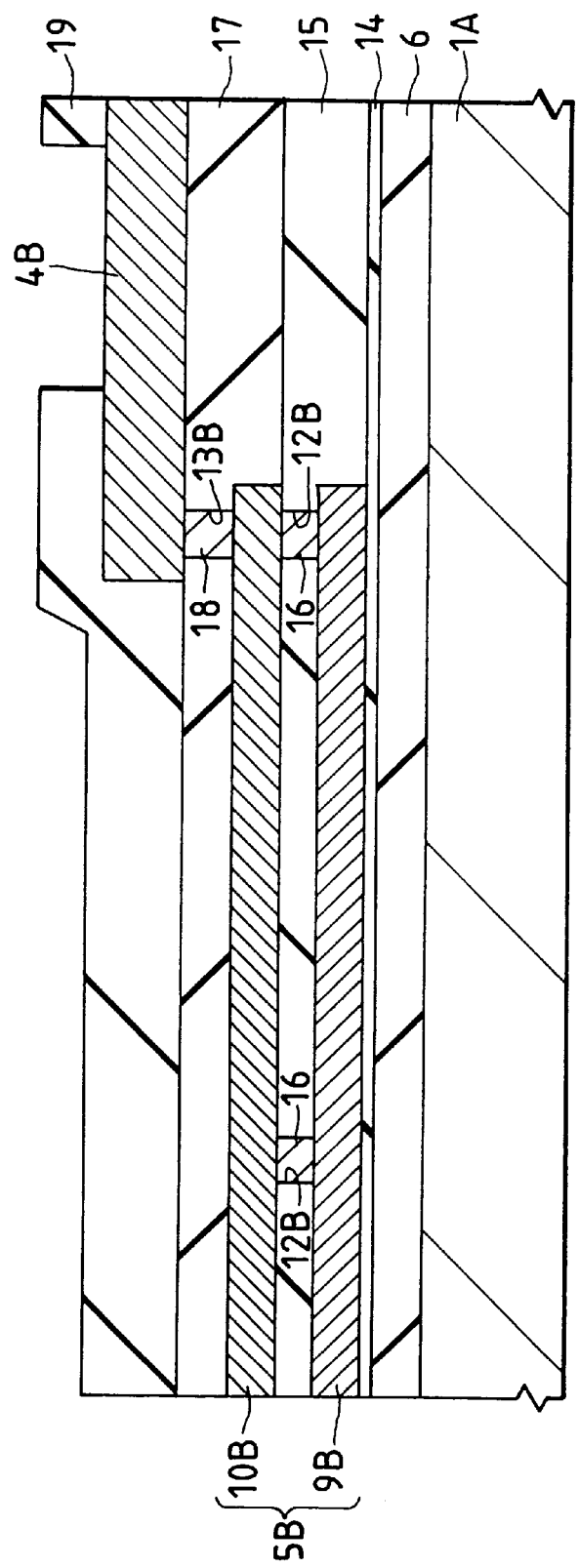

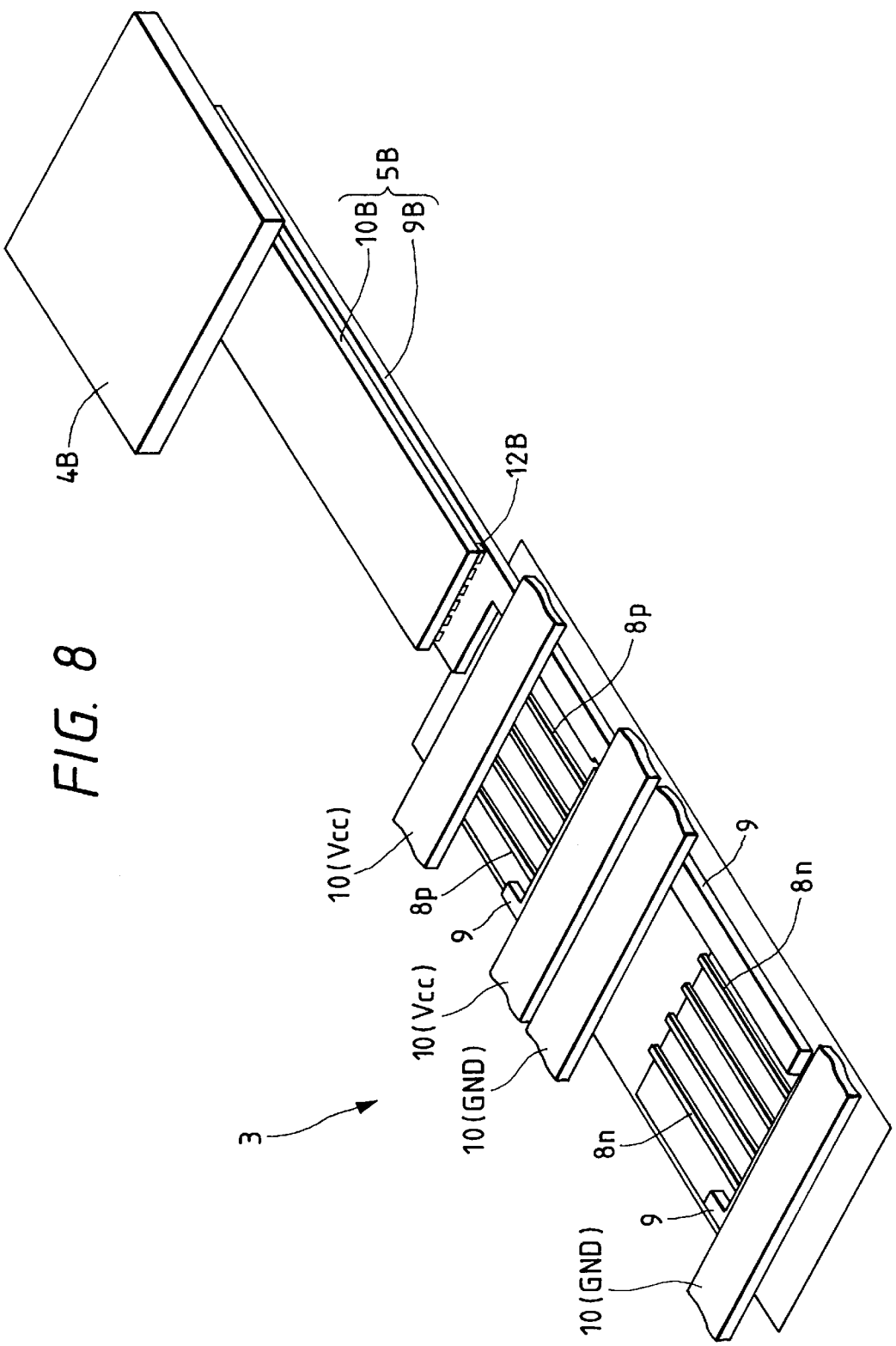

SEMICONDUCTOR INTEGRATED CIRCUIT

CROSS-REFERENCE TO RELATED APPLICATION

This application is a continuation of application Ser. No. 08/838,260, filed on Apr. 17, 1997, the entire disclosure of which is hereby incorporated by reference.

BACKGROUND OF THE INVENTION

The present invention relates to a semiconductor integrated circuit, and more particularly to technology effectively applicable to a semiconductor integrated circuit with a zigzag arrangement of bonding pads.

A typical gate array logic LSI has a logic portion formed of a matrix of many basic cells arranged in the central portion of the main surface of a semiconductor chip. A plurality of input/output buffer circuits are arranged outside the logic portion in such a way as to surround the logic portion. Further, a plurality of bonding pads (external terminals) for providing electrical connection with an external unit are arranged outside the input/output buffer circuits, that is, on the outermost peripheral portion of the semiconductor chip. These bonding pads are arranged in positions corresponding to the positions of the input/output buffer circuits. A logic LSI using a gate array system has been described in U.S. Pat. No. 5,075,753, for example.

In a current logic LSI of the sort that uses such a gate array system, two or three lines of bonding pads are arranged along the outer periphery of a semiconductor chip to deal with an increase in the number of external terminals resulting from a demand for a gate which is larger in scale. Further, the bonding pads are arranged in a zigzag manner by shifting the line-to-line positions of the bonding pads by ½ pitch. With this zigzag arrangement, more bonding pads become available in a semiconductor chip of the same size because the effective pitch of the bonding pads is reducible.

Japanese Patent Laid-Open Publication No. 29377/1993, for example, discloses a logic LSI with bonding pads employing such a zigzag arrangement.

The logic LSI as disclosed in the publication above is arranged such that, in the case of three layers of wiring, for example, two lines of bonding pads are arranged along the outer periphery of a semiconductor chip in a zigzag manner by shifting the line-to-line positions of the bonding pads by ½ pitch. The bonding pads are formed in a wide third layer of wiring and a narrow second layer of wiring, and outgoing wiring for connecting the bonding pads and internal circuits is formed in a first layer of wiring.

When two lines of bonding pads are arranged in a zigzag manner decreasing the pitch of the bonding pads causes the outgoing wiring of the bonding pads on the outer line side to overlap with the bonding pads on he inner line side, which results in forming a combined capacitance between the bonding pad and the outgoing wiring that have been overlapped.

In a case where the bonding pads are formed in the wide third layer of wiring and the narrow second layer of wiring as referred to in the patent laid-open publication cited above, two layers of layer-to-layer insulating films are held between the wide third layer of wiring for forming part of the bonding pad and the first layer of wiring for forming the outgoing wiring (the first layer-to-layer insulating film for electrically separating the first layer of wiring from the second layer of wiring and the second layer-to-layer insulating film for electrically separating the second layer of wiring from the third layer of wiring), whereby the combined capacitance between the bonding pad and outgoing wiring that have been overlapped is reduced. Moreover, the outgoing wiring and the bonding pad are not overlapped because the second layer of wiring forming part of the bonding pad is narrow. Consequently, no problem is posed about the combined capacitance between the second layer of wiring and the outgoing wiring.

SUMMARY OF THE INVENTION

Since the outgoing wiring for connecting the bonding pads and the internal circuits in the logic LSI is formed in the first layer of wiring, the micronization of wiring accompanying that of the semiconductor elements decreases the allowable current of the outgoing wiring and consequently the bonding pads become hardly connectable to a power supply (Vcc, GND) line and a signal line through which a large current flows.

In order to cope with this drawback, the use of two layers, including the first layer of wiring and the second layer of wiring for the outgoing wiring of the bonding pads on the inner line side makes it possible to increase the allowable current of the outgoing wiring. In this case, however, the bonding pads connectible to the power supply (Vcc, GND) and the signal line through which a large current flows are restricted to those pads on the inner line side, and the resulting problem is that the stretching of wiring for connecting the internal circuits and the bonding pads becomes difficult. Moreover, the user normally decides which one of the pins to be a power supply line (Vcc, GND) or a signal line in a logic LSI using the gate array system. Therefore, any restriction placed on the bonding pads on the inner or outer line side tends to reduce the design freedom on the part of the user.

An object of the present invention is to provide a way of making the pitch of bonding pads narrower.

Another object of the present invention is to provide a way of equalizing the current density in the whole bonding pad formed in a semiconductor chip.

These and other objects and novel features of the invention may be readily ascertained by referring to the following description and appended drawings.

A brief description will be given of the substance of the invention disclosed in the present patent application.

In a semiconductor integrated circuit having a plurality of lines of bonding pads arranged along the outer periphery of a semiconductor chip according to the present invention, the bonding pads on the inner line side and the bonding pads on the outer line side being arranged in a zigzag manner and having three more layers of wiring, (1) first outgoing wiring for electrically connecting the bonding pads on the inner line side to internal circuits (input/output buffer circuits) is formed in one layer of wiring or a plurality of layers of wiring including at least the uppermost layer of wiring, and second outgoing wiring for electrically connecting the bonding pads on the outer line side to the internal circuits (the input/output buffer circuits) is formed in a plurality of layers of wiring other than the layer in which the first outgoing wiring is formed. Further, (2) the first outgoing wiring and the second outgoing wiring are formed in different layers of wiring and at least one of the outgoing wiring films is formed with a plurality of layers of wiring.

In the case of three layers of wiring, for example, the first outgoing wiring is formed in the uppermost third layer of wiring, and the second outgoing wiring is formed in the second layer of wiring together with the third layer of wiring. In the case of five layers of wiring, for example, the first outgoing wiring is formed in the uppermost fifth layer of wiring together with the fourth layer of wiring, and the second outgoing wiring is formed in the third layer of wiring together with the second layer of wiring and the first layer of wiring.

The semiconductor integrated circuit according to the present invention is constructed such that, by making the sectional area of the first outgoing wiring film substantially equal to that of the second outgoing wiring film, the density of a current flowing through each outgoing wiring is substantially equalized.

Since the width and pitch of the outgoing wiring connecting the bonding pads and the internal circuits can be narrowed according to the present invention, the pitch of the bonding pads can also be narrowed. Consequently, more bonding pads are formable in a semiconductor chip of the same size, whereby a large-scale CMOS gate array having a greater number of external terminals is attainable.

Since the density of the current flowing through the outgoing wiring of the whole bonding pad arranged on the outer periphery of the semiconductor chip can substantially be equalized according to the present invention, and since a large current can be made to flow through the outgoing wiring of the whole bonding pad, bonding pads to be connected to the power supply line (Vcc, GND) and the signal line through which a large current flows are freely selectable, and the freedom of logic design using the automatically-arranged wiring system is improved as well.

BRIEF DESCRIPTION OF THE DRAWINGS

FIG. 3 is a perspective view showing the bonding pad on the inner line side, the input/output buffer circuit, and the outgoing wiring for connecting them in the semiconductor integrated circuit according to the first embodiment of the invention.

FIG. 7(b) is a sectional view take along line B—B of FIG. 7(a).

FIG. 8 is a perspective view of the bonding pad on the outer line side, the input/output buffer circuit, and the outgoing wiring for connecting them in the semiconductor integrated circuit according to the first embodiment of the invention.

DESCRIPTION OF THE PREFERRED EMBODIMENTS

Figure 1:
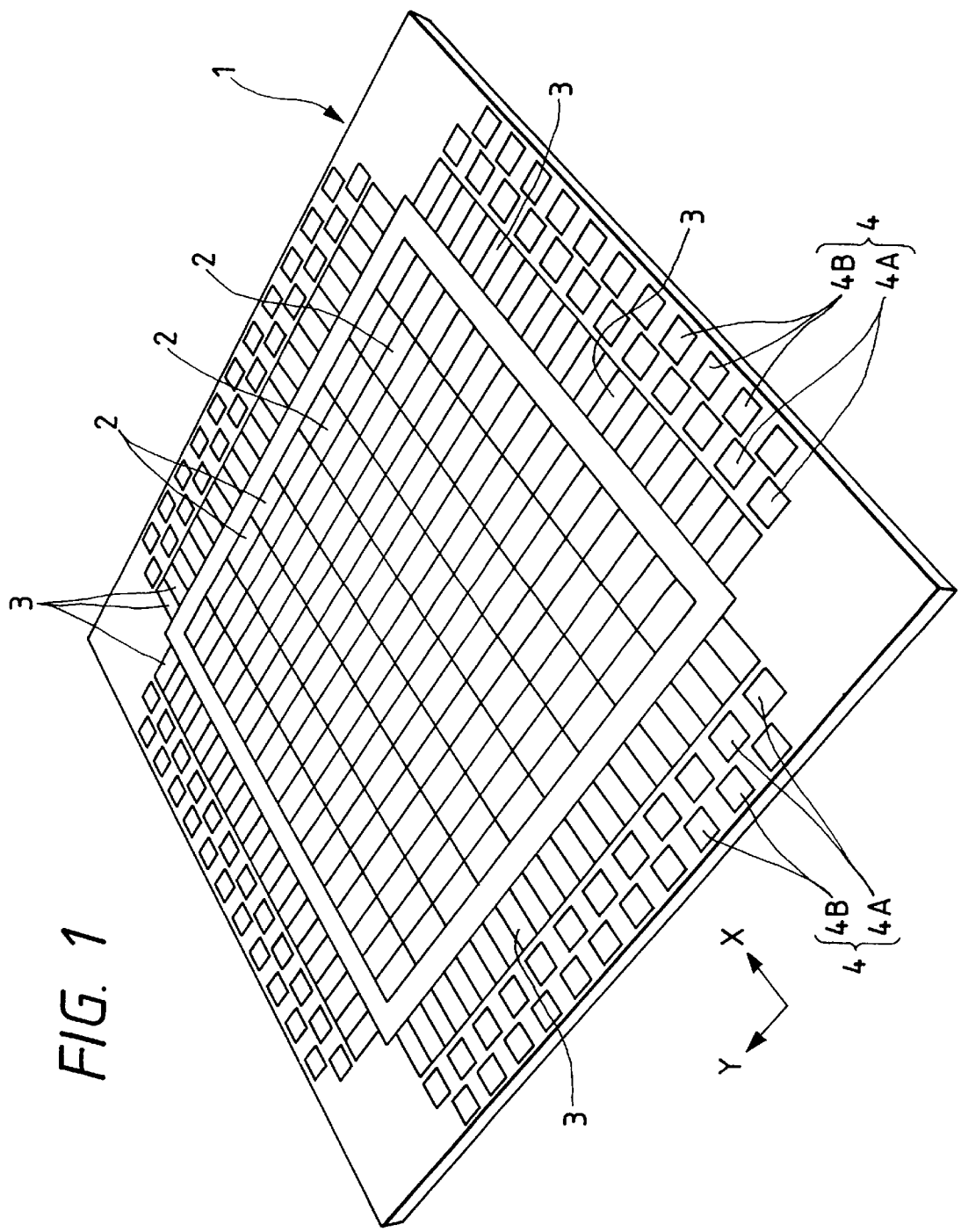
FIG. 1 is a perspective view of a semiconductor chip on which a semiconductor integrated circuit according to a first embodiment of the invention is formed.

A detailed description will subsequently be given of various embodiments of the present invention and possible variations thereof by reference to the accompanying drawings. In the drawing used to explain the embodiments of the present invention, like reference characters each designate elements having like or corresponding functions and the repeated description of them will be omitted.
(Embodiment 1)

A semiconductor integrated circuit embodying the present invention is formed of a gate array CMOS (Complementary Metal Oxide Semiconductor) having a three-layer wiring structure. FIG. 1 shows a semiconductor chip in which the CMOS gate array has been formed.

In the central portion on the main surface of a semiconductor chip 1 made of single crystal silicon are a number of basic cells 2 constituting the logic portion (logic circuit portion) of a gate array, that is, a matrix of basic cells which are arranged along X and Y directions. A number of basic cells 2 are formed in the area of the gate system. Each basic cell 2 is formed by combining a predetermined number of n-channel MISFETs (Metal Insulator Semiconductor Field Effect Transistors) and a predetermined number of p-channel MISFETs (MISFETs are not shown), and by connecting MISFETs in each basic cell 2 and connecting the basic cells 2 on the basis of a logic design, a desired logic function is attained.

In order to attain such a logic function, an automatically-arranged wiring system (DA: Design Automation) using CAD (Computer Aided Design) is employed for connecting the MISFETs and the basic cells. In the automatically-arranged wiring system, logic circuits are connected through the steps of automatically laying out the logic circuits designed and verified on the semiconductor chip 1 and automatically laying out wiring at the X-Y lattice coordinates virtually set on the logic circuits. In the case of such a gate array having the three-layer wiring structure, the first and third layers of wiring, for example, are mainly arranged at the X-lattice coordinates, whereas the second layer of wiring is mainly arranged at the Y-lattice coordinates. In the gate array according to this embodiment of the invention, the first layer of wiring forms, for example, signal wiring and power supply wiring (Vcc and GND); the second layer of wiring forms power supply wiring (Vcc and GND) and signal wiring; and the third layer of wiring forms power supply wiring and signal wiring for a bonding pad (external thermal) conductive layer, which will be described later. The first-to-third layers of wiring are made of, for example, aluminum (Al) alloy.

A plurality of input/output (I/O) buffer circuits 3 are formed in such a way as to surround the logic portion. Like the basic cell 2, each input/output buffer circuit 3 is formed by combining a predetermined number of n-channel MISFETs and a predetermined number of p-channel MISFETs, and it has been arranged such that, by varying the MISFET-to-MISFET connection pattern, the function of an input buffer circuit, an output buffer circuit or a bi-directional buffer circuit can be provided.

A plurality of bonding pads (external terminals) 4 for providing electrical connection with an external unit are arranged around the input/output buffer circuits 3, that is, in the peripheral portion of the semiconductor chip 1. These bonding pads are arranged in positions corresponding to the arrangement of the input/output buffer circuits 3 and each bonding pad 4 and the corresponding input/output buffer circuit 3 are electrically connected via outgoing wiring.

In order to deal with an increased number of external terminals accompanying a larger-scale logic circuit, the CMOS gate array according to this embodiment of the invention has two lines of the bonding pads 4 arranged on each side of the semiconductor chip 1 in a zigzag manner by shifting the line-to-line positions of the bonding pads 4 by ½ pitch.

Further, the third layer of wiring is used to form the two lines of the bonding pads 4 (bonding pads A and bonding pads B) in the CMOS gate array according to this embodiment of the invention and also is used as outgoing wiring for connecting the bonding pads 4A on the inner line side and the corresponding input/output buffer circuits 3. Whereas the first and second layers of wiring are used to form outgoing wiring for connecting the bonding pads 4B on the outer line side and the corresponding input/output buffer circuits 3. In other words, different layers of wiring are used to form the outgoing wiring for the bonding pads 4A and the bonding pads 4B on the inner and outer line sides in the CMOS gate array according to this embodiment of the invention, and the two layers of wiring are used to form the outgoing wiring for the bonding pads 4B on the outer line side.

A detailed description will subsequently be given of the bonding pads 4A, 4B arranged in two lines and outgoing wiring connected thereto.

Figure 2A:
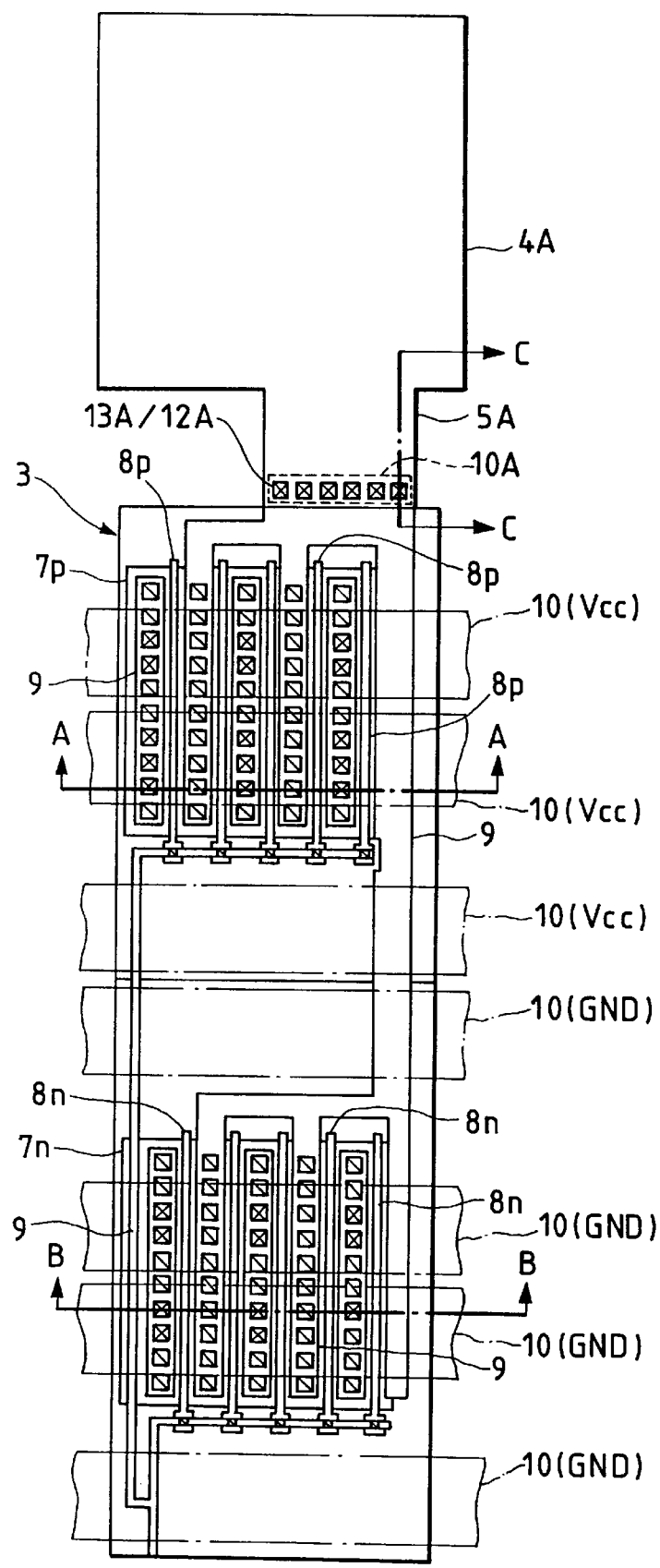
FIG. 2(a) is a plan view showing a bonding pad on the inner line side, an input/output buffer circuit, and outgoing wiring for connecting them in the semiconductor integrated circuit according to the first embodiment of the invention.
Figure 2B:
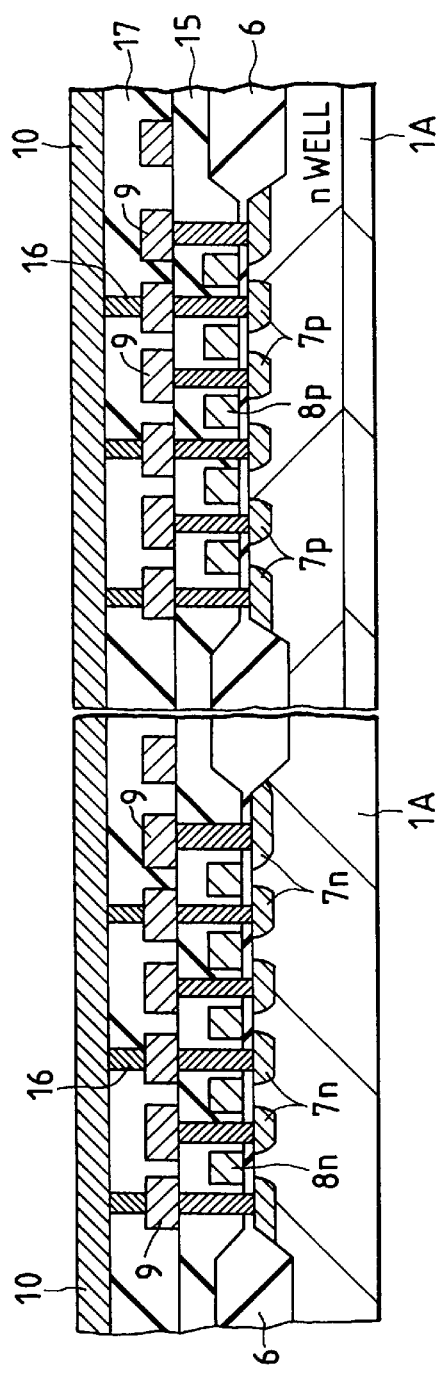
FIG. 2(b) is a sectional view taken along line A—A and line B—B of FIG. 2(a).
Figure 2C:
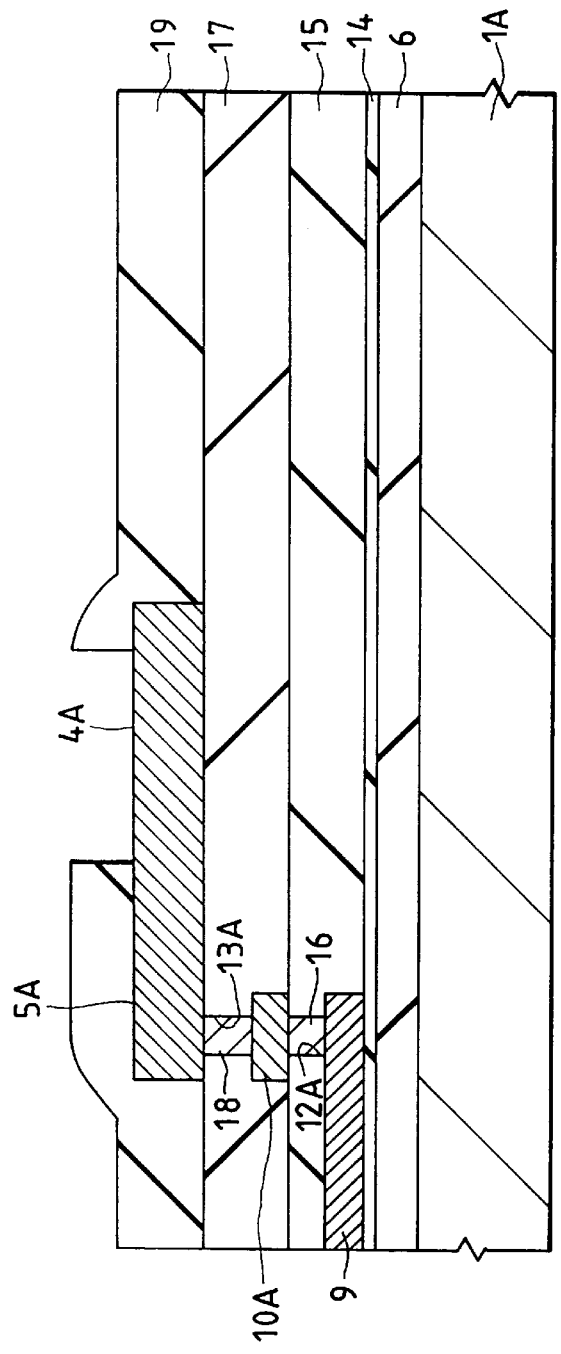
FIG. 2(c) is a sectional view taken along line C—C of FIG. 2(a).
Figure 4:
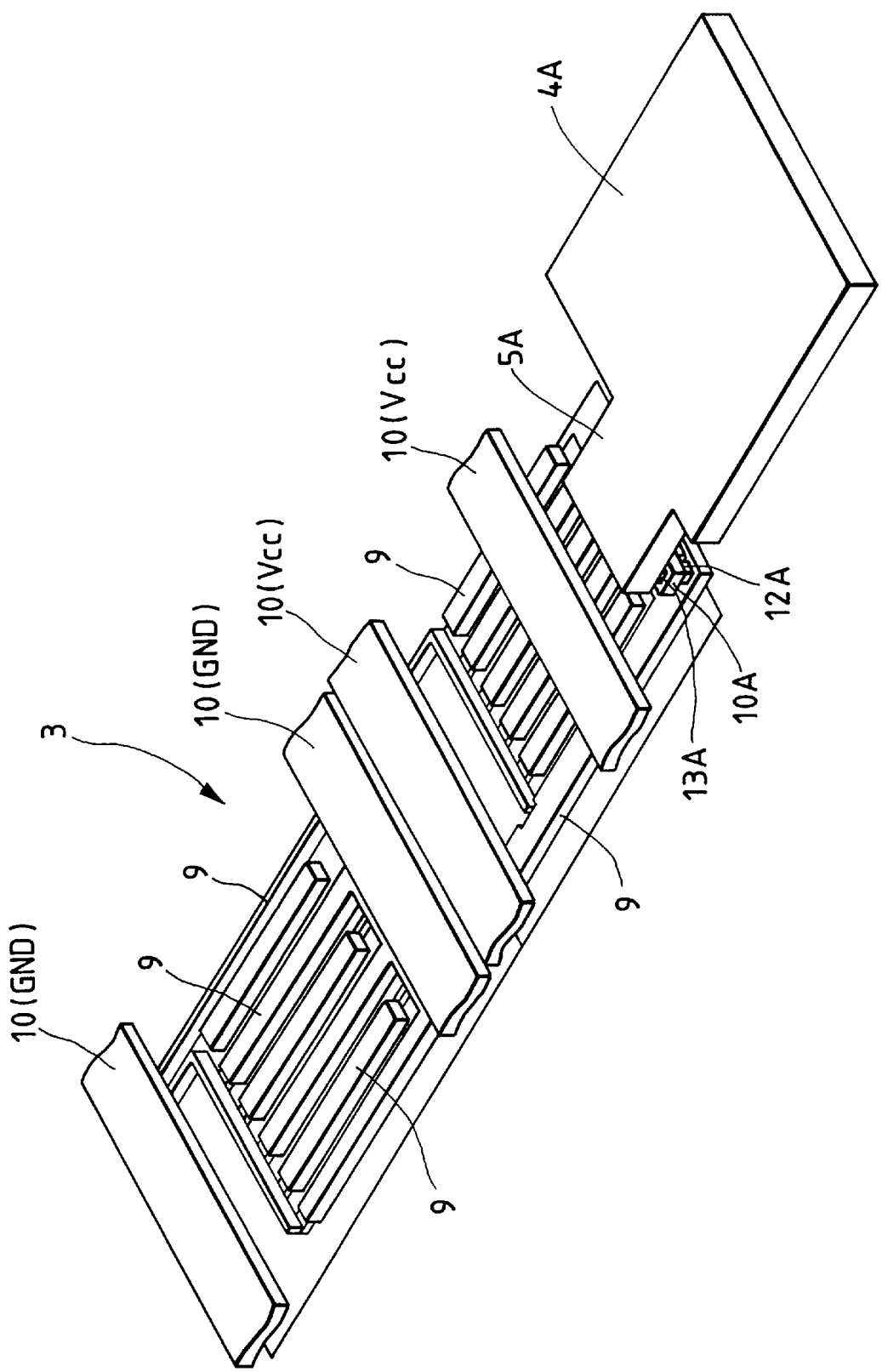
FIG. 4 is a perspective view showing the bonding pad on the inner line side, the input/output buffer circuit, and the outgoing wiring for connecting them in the semiconductor integrated circuit according to the first embodiment of the invention.

FIG. 2(a) is a plan view showing the bonding pad 4A on the inner line side, the input/output buffer circuit 3 and the outgoing wiring 5A for connecting them; the right side of FIG. 2(b) is a sectional view taken on line A—A of FIG. 2(a); the left side of FIG. 2(b) is a sectional view taken on line B—B thereof; FIG. 2(c) is a sectional view taken on line C—C thereof; and FIGS. 3–4 are perspective views thereof. For convenience of illustration, a conductive layer for use in forming the bonding pad 4A, the input/output buffer circuit 3 and the outgoing wiring 5A, and connection holes for electrically connecting them are only shown with the omission of the illustration of a layer-to-layer insulating film for electrically separating the conductive layers.

Figure 5A:
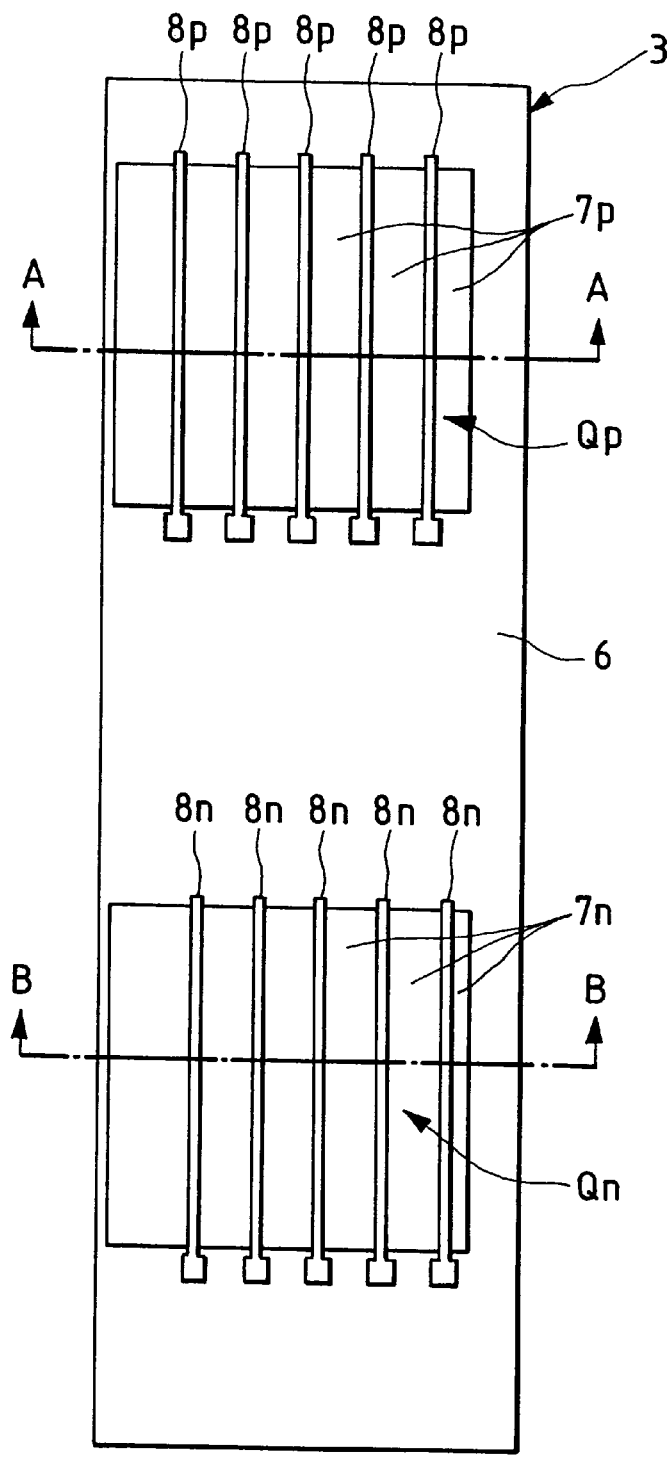
FIG. 5(a) is a plan view of the input/output buffer circuit in the semiconductor integrated circuit according to the first embodiment of the invention.
Figure 5B:
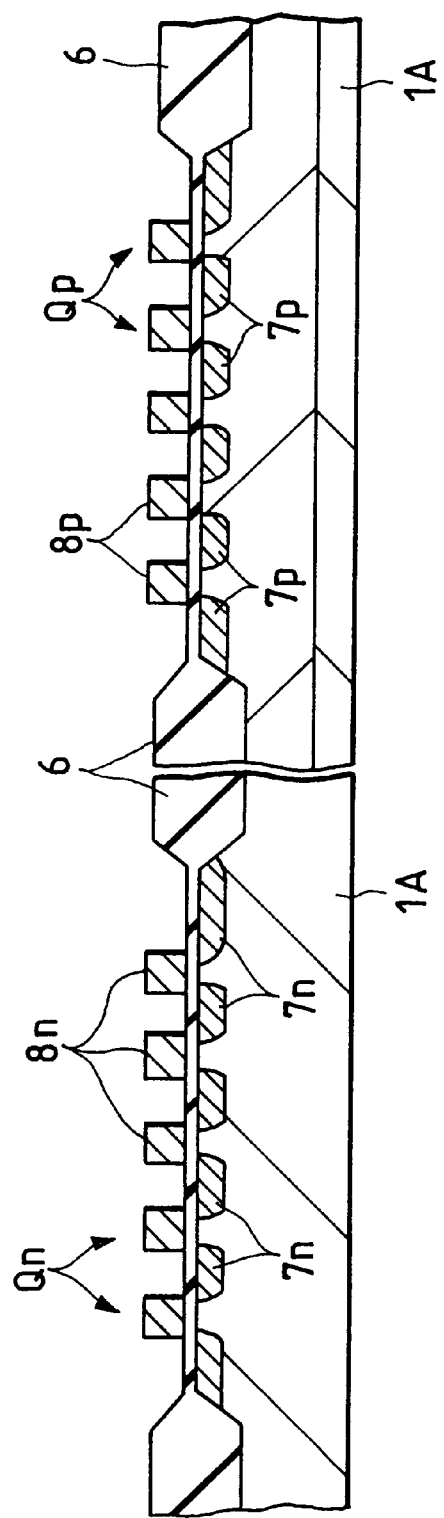
FIG. 5(b) is a sectional view taken along line A—A and line B—B of FIG. 5(a).
Figure 6:
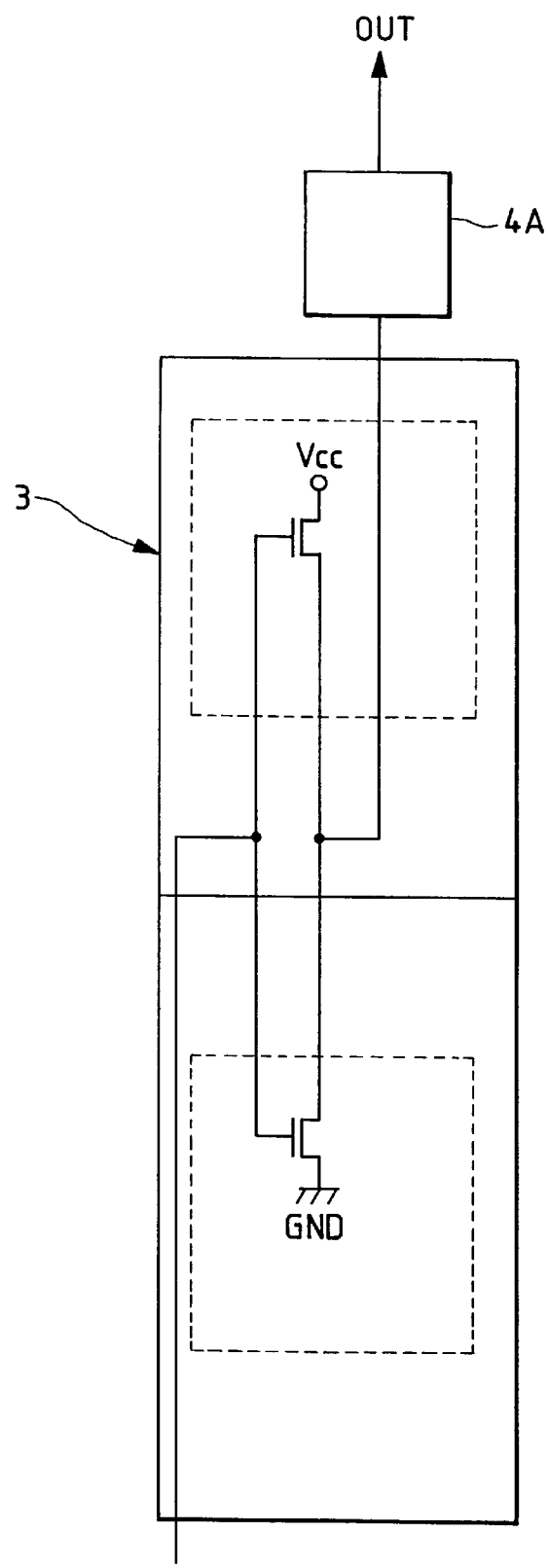
FIG. 6 is a circuit diagram of the input/output buffer circuit in the semiconductor integrated circuit according to the first embodiment of the invention.

For convenience of illustration, the illustration of part of the power supply wiring 10 is also omitted in FIGS. 3–4. The input/output buffer circuit 3 is formed by combining a predetermined number of n-channel MISFETs Qn and a predetermined number of p-channel MISFETs Qp. In an area where the input/output buffer circuit 3 is formed, there are formed a pair of diffusion layers (n-type diffusion layers 7n and p-type diffusion layers 7p) which are separated from each other by a field insulating film 6 having a pattern as shown in FIGS. 5(a)–5(b) and which function as source and drain regions. Further, a gate electrode 8n of an n-channel MISFET is formed on the channel forming area formed between the n-type diffusion layers 7n and a gate electrode 8p of a p-channel MISFET is formed on the channel forming area formed between the p-type diffusion layers 7p, a plurality of gate electrode 8n and a plurality of gate electrodes 8p being arranged in the direction X (or Y) respectively via gate insulating films. These gate electrodes 8n, 8p are made of, for example, polysilicon. Incidentally, the right side of FIG. 5(b) is a sectional view taken on line A—A of FIG. 5(a); and the left side of FIG. 5(b) is a sectional view taken on line B—B thereof. Further, the n-type diffusion layers 7n on both sides of the gate electrode 8n form the source and drain regions of the n-channel MISFET, whereas the p-type diffusion layers 7p each on both sides of the gate electrode 8p form the source and drain regions of the p-channel MISFET. The first layer of wiring 9 serving as the signal wiring and the second layer of wiring 10 serving as the power supply wiring (Vcc and GND) are used to connect the n-channel MISFETs and the p-channel MISFETs with the pattern shown in FIGS. 2–4 so as to form an output buffer circuit, for example, as shown in FIG. 6. More specifically, the power supply wiring 10 (Vcc) is electrically connected via the first layer of wiring 9 to the p-type diffusion layer 7p serving as the source region of the p-channel MISFET Qp and the p-type diffusion layer 7p serving as the drain region of the p-channel MISFET Qp is electrically connected to the first layer of wiring 9 of the input/output buffer circuit 3. The power supply wiring 10 (Vcc) is electrically connected via the first layer of wiring 9 to the n-type diffusion layer 7n serving as the source region of the n-channel MISFET Qn, and the n-type diffusion layer 7n serving as the drain region of the n-channel MISFET Qn is electrically connected to the first layer of wiring of the input/output buffer circuit 3.

As shown in FIGS. 2(a), 2(b) and 3–4, the third layer of wiring is used as the outgoing wiring 5A for connecting the input/output buffer circuit 3 and the bonding pad 4A, and is made integral with the bonding pad 4A. The outgoing wiring 5A and the first layer of wiring 9 of the input/output buffer circuit 3 are electrically connected via pad wiring 10A in the same layer as the second layer of wiring 10 as the power supply wiring (Vcc, GND) to one end portion of the input/output buffer circuit 3. The first layer of wiring 9 and the pad wiring 10A thereon are electrically connected through connection holes 12A bored in a first layer-to-layer insulating film 15 for electrically separating the first layer of wiring from the pad wiring. Moreover, the pad wiring 10A and the outgoing wiring 5A thereon are electrically connected through connection holes 13A bored in a second layer-to-layer insulating film 17 for electrically separating the pad wiring from the outgoing wiring 5A.

The power supply wiring 10 (Vcc), 10 (Vss) is extended in such a way as to surround the logic portion on the input/output buffer circuits 3 disposed along the peripheral portion of the semiconductor chip 1. In this case, though not shown, the power supply wiring (Vcc and GND) formed in the third layer of wiring is situated via the layer-to-layer insulating film with the same pattern as the pattern of the power supply wiring thereunder on the power supply wiring 10 (Vcc), 10 (Vss). The power supply wiring (Vcc and GND) formed in the second and third layers of wiring has been described in, for example, U.S. Pat. No 5,075,753, the contents of which will be incorporated herein by reference.

Figure 7A:
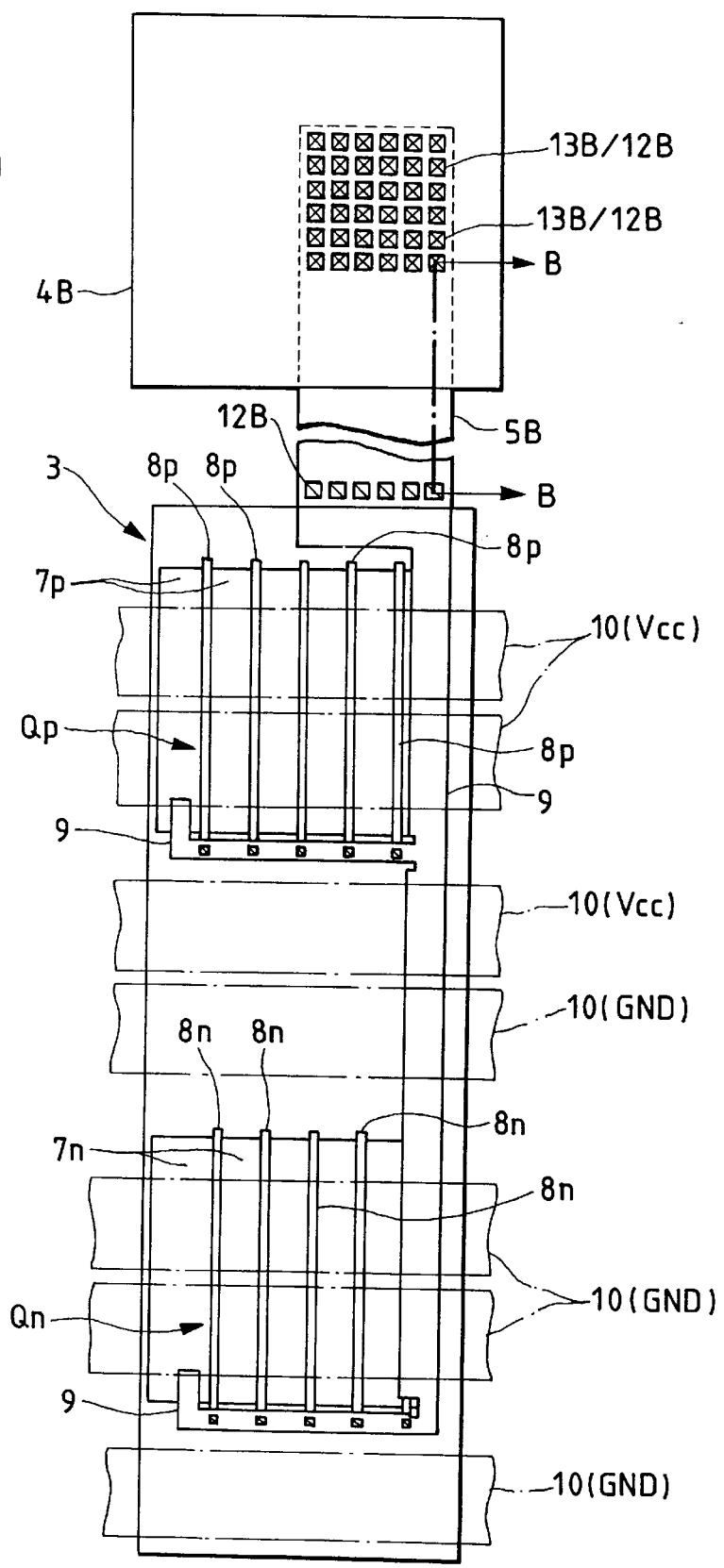
FIG. 7(a) is a plan view showing a bonding pad on the outer line side, the input/output buffer circuit, and the outgoing wiring for connecting them in the semiconductor integrated circuit according to the first embodiment of the invention.
Figure 9:
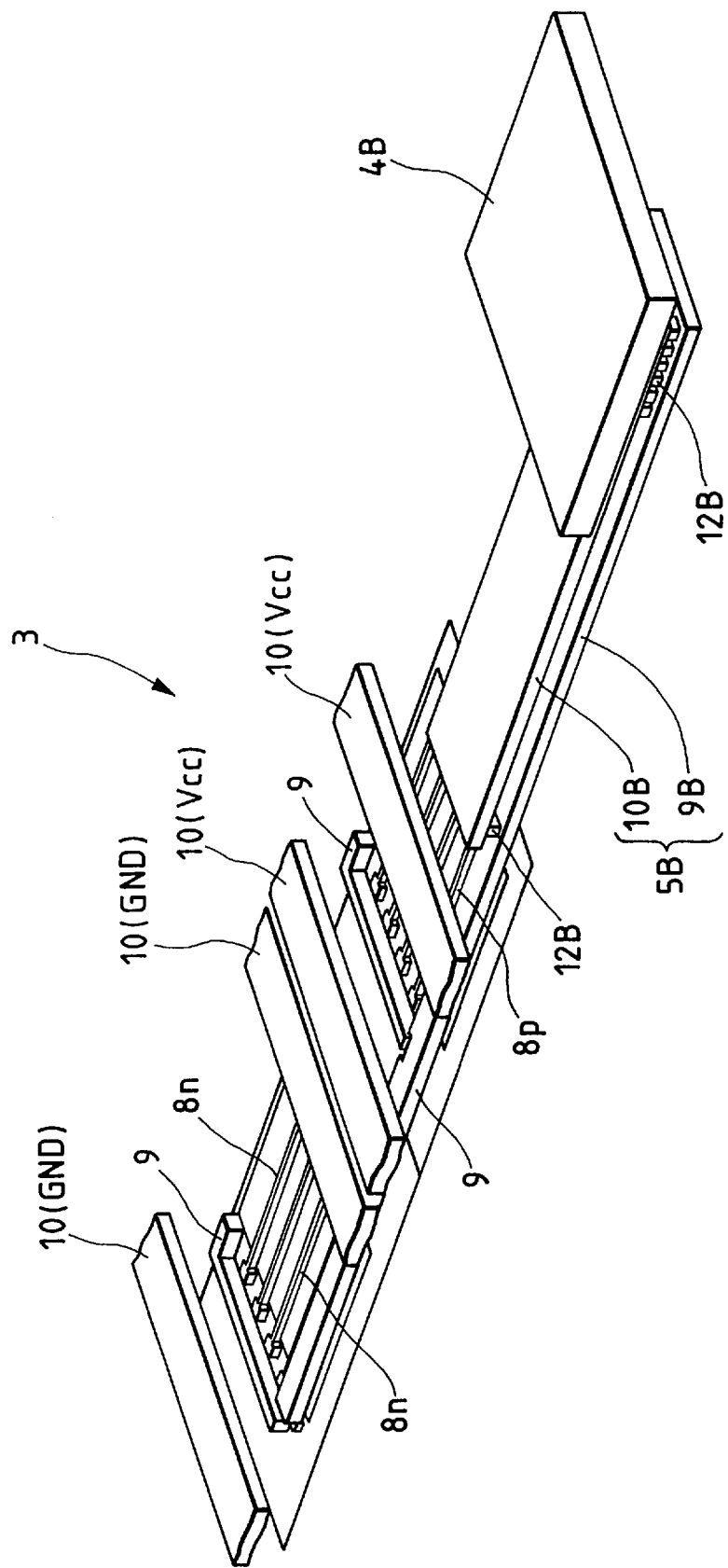
FIG. 9 is a perspective view of the bonding pad on the outer line side, the input/output buffer circuit, and the outgoing wiring for connecting them in the semiconductor integrated circuit according to the first embodiment of the invention.

FIG. 7(a) is a plan view showing the bonding pad 4B on the outer line side, the input/output buffer circuit 3 the outgoing wiring 5B; FIG. 7(b) is a sectional view taken on line B—B of FIG. 7(a); and FIGS. 8–9 are perspective views thereof. As in FIGS. 2–4, a conductive layer for use in forming the bonding pad 4B, the input/output buffer circuit 3 and the outgoing wiring 5B, and connection holes for electrically connecting them are only shown with the omission of the illustration of a layer-to-layer insulating film for electrically separating the conductive layers. For convenience of illustration, the illustration of part of the power supply wiring 10 is also omitted in FIGS. 8–9.

Figure 10:
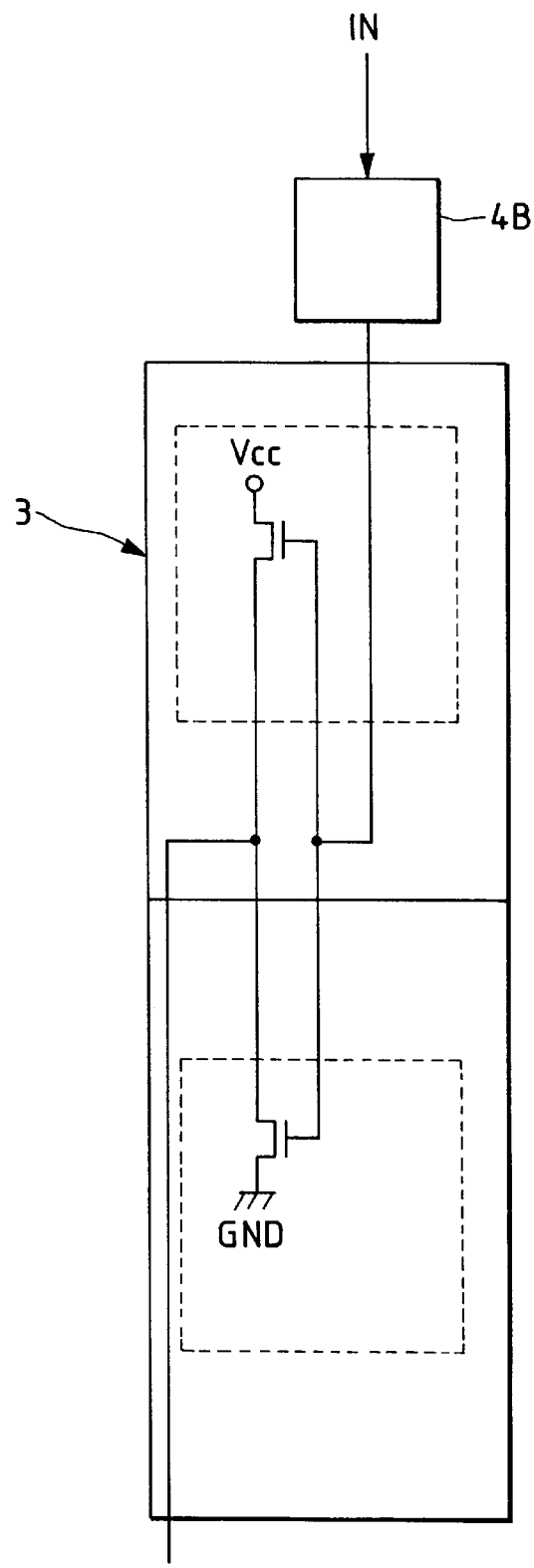
FIG. 10 is a circuit diagram of an input buffer circuit in the semiconductor integrated circuit according to the first embodiment of the invention.

Like the input/output buffer circuit 3 connected to the bonding pad 4B on the inner line side, the input/output buffer circuit 3 is formed by combining a predetermined number of n-channel MISFETs Qn and a predetermined number of p-channel MISFETs Qp. The first layer of wiring 9 serving as the signal wiring and the second layer of wiring 10 serving as the power supply wiring (Vcc and GND) are used to connect the n-channel MISFETs Qn and the p-channel MISFETs Qp with the pattern shown in FIGS. 7–9 so as to form an input buffer circuit, for example, as shown in FIG. 10. In other words, the first layer of wiring 9 of the input/output buffer circuit 3 is electrically connected to the gate electrodes 8p, 8n of the n- and the p-channel MISFETs Qn, Qp. Further, the source region of the n-channel MISFET Qn is electrically connected via the first layer of wiring 9 to the power supply wiring 10 (Vss), whereas the source region of the p-channel MISFET Qp is electrically connected via the first layer of wiring 9 to the power supply wiring 10 (Vcc). The input/output buffer circuit 3 may serve as an output buffer circuit as shown in FIG. 6, for example, by varying the connection pattern; that is, the input/output buffer circuit 3 may serve various circuit functions to be performed by an input buffer circuit, an output buffer circuit or a bi-directional buffer circuit by varying the connection pattern in accordance with the logic function.

As shown in FIGS. 7(a), 7(b) and FIGS. 8–9, the outgoing wiring 5B for connecting the input/output buffer circuit 3 and the bonding pad 4B is made integral with the first layer of wiring 9 serving as the signal wiring, and is formed with wiring 9B extending from the one end of the input/output buffer circuit 3 up to the lower portion of the bonding pad 4B and wiring 10B in the same layer as the second layer of wiring 10 serving as the power supply wiring (Vcc and GND). The wiring 10B is formed with, for example, the same pattern as that of the wiring 9B and is disposed in such a way as to be superposed on the wiring 9B.

The aforementioned two layers of wiring 9B, 10B constituting the outgoing wiring 5B are electrically connected through connection holes 12B bored in the first layer-to-layer insulating film 15 for electrically separating them in one end portion of the input/output buffer circuit 3 and beneath the bonding pad 4B. Further, the wiring 10B and the bonding pad 4B formed in the third layer of wiring are electrically connected through connection holes 13B bored in the second layer-to-layer insulating film 17 for electrically separating them beneath the bonding pad 4B.

Thus, the two layers of wiring 9B, 10B constitute the outgoing wiring 5B of the bonding pads 4B on the outer line side, and the outgoing wiring 5B is formed in a layer of wiring different from the outgoing wiring 5A.

Figure 11:
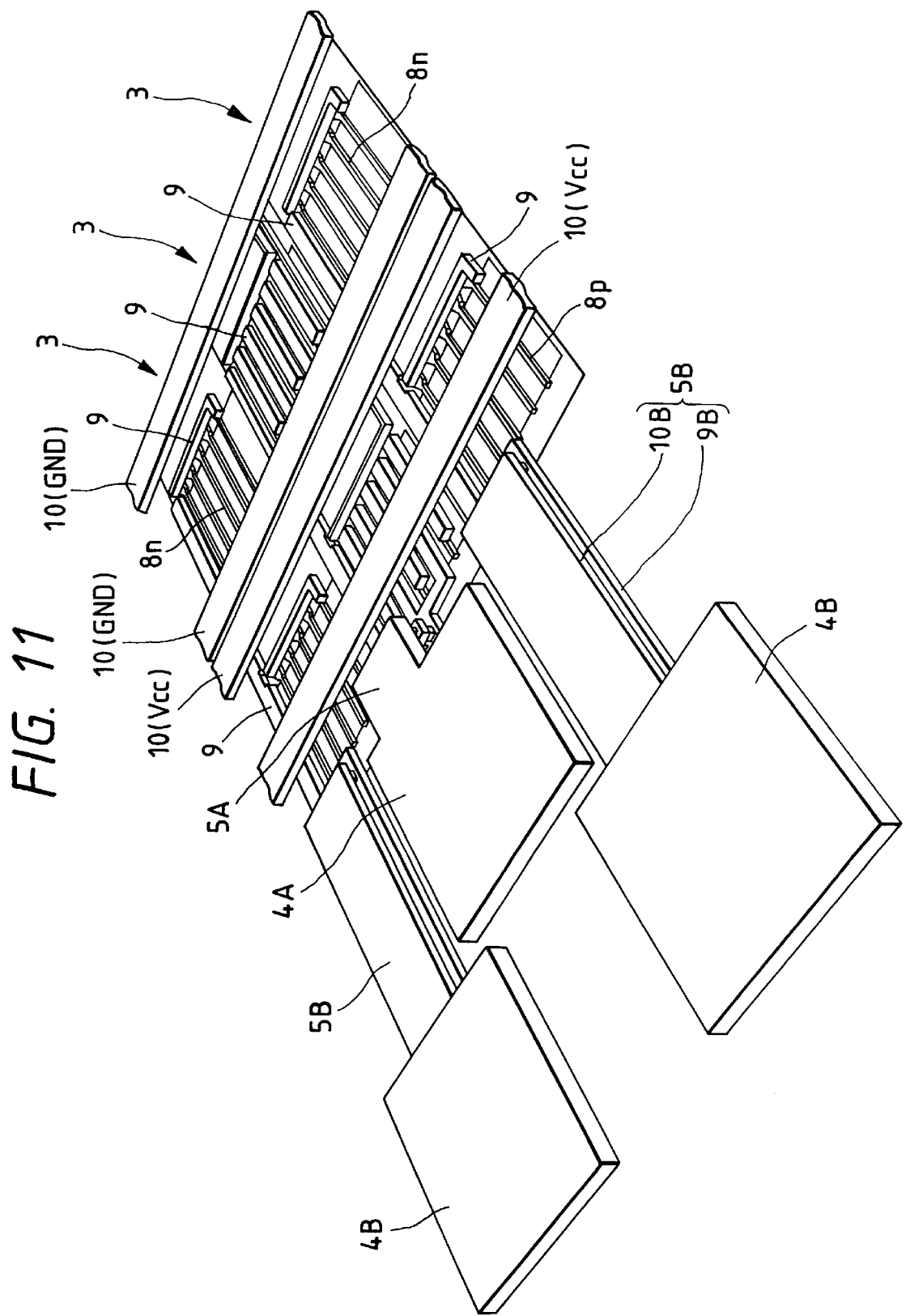
FIG. 11 is a perspective view showing the bonding pads, the input/output buffer circuits and the outgoing wiring in the semiconductor integrated circuit according to the first embodiment of the invention.
Figure 12:
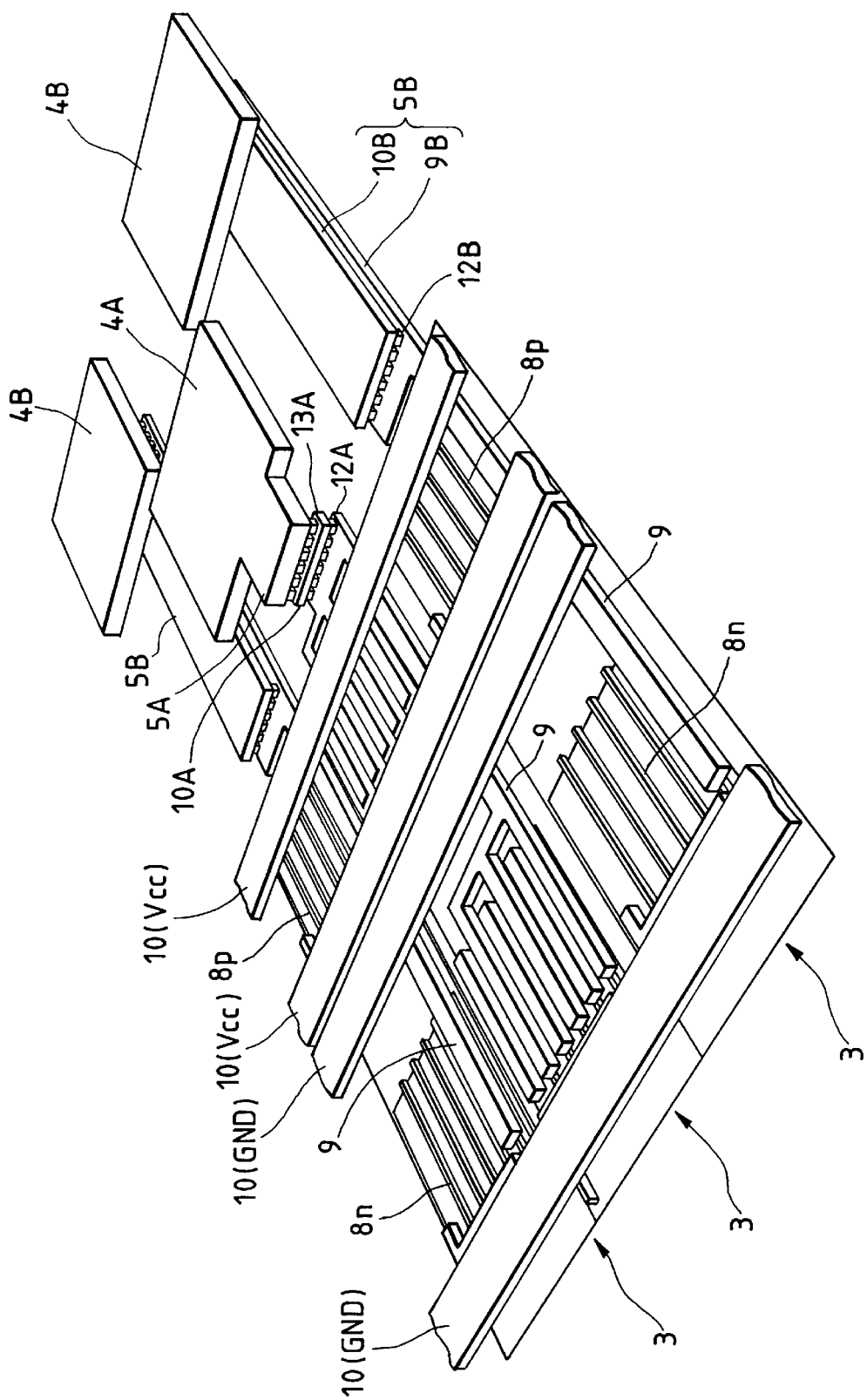
FIG. 12 is a perspective view showing the bonding pads, the input/output buffer circuits and the outgoing wiring in the semiconductor integrated circuit according to the first embodiment of the invention.
Figure 13:
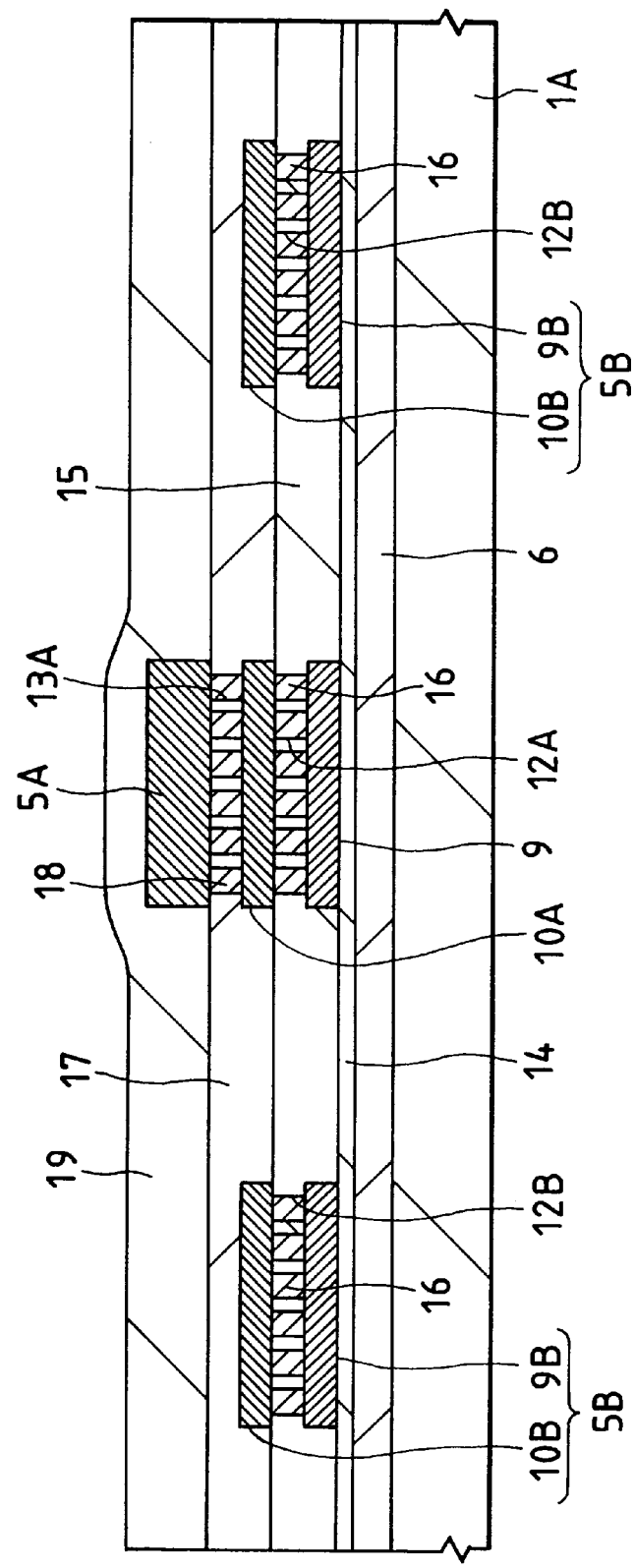
FIG. 13 is a sectional view showing the structure of the outgoing wiring in the semiconductor integrated circuit according to the first embodiment of the invention.
Figure 22:
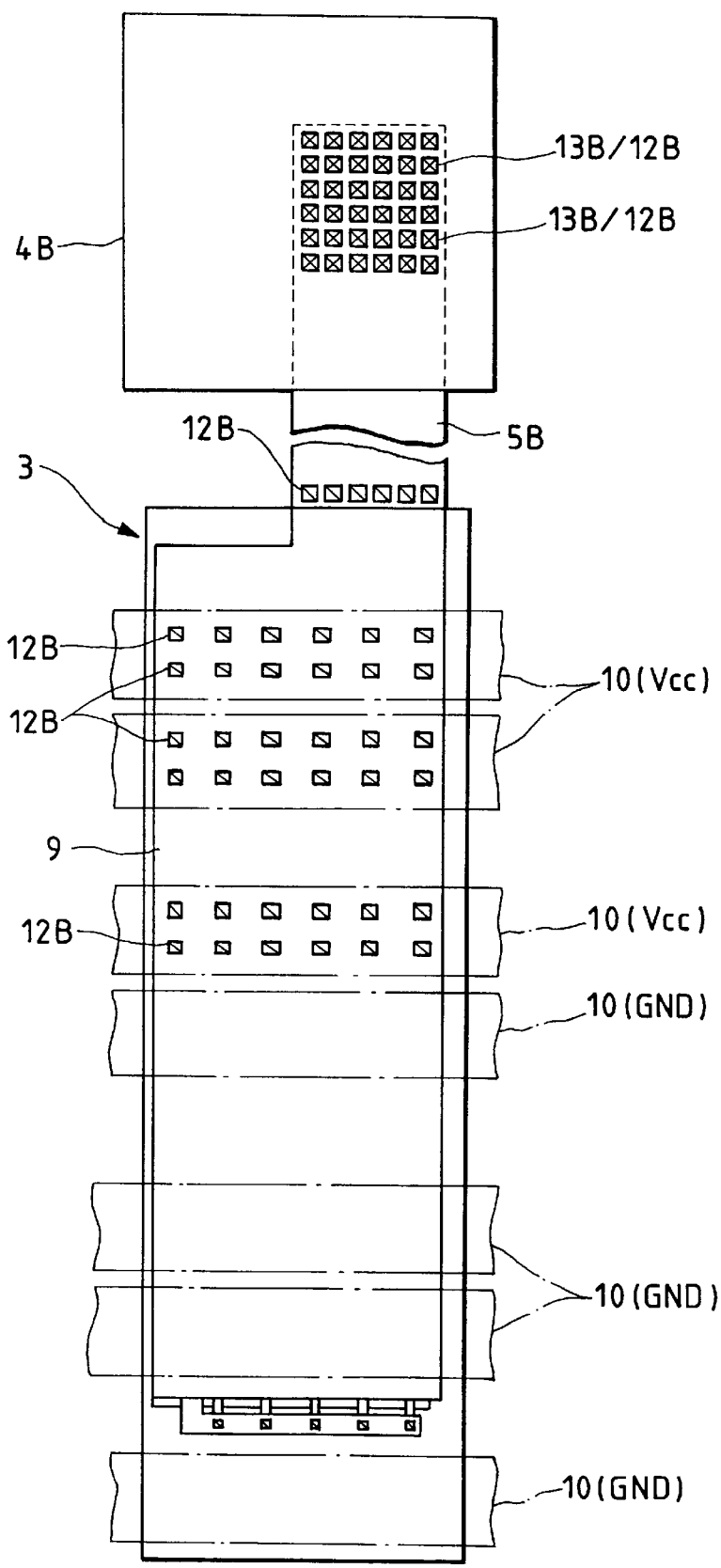
FIG. 22 is a plan view showing the bonding pad on the outer line side, the outgoing wiring and the power supply wiring in the semiconductor integrated circuit according to the first embodiment of the invention.

FIGS. 11–12 are perspective views showing an arrangement of three sets of input/output buffer circuits 3, outgoing wiring 5A, 5B and bonding pads 4A, 4B. FIG. 22 shows a layout in a case where the bonding pads 4B are used as power supply voltage pads (Vcc). The outgoing wiring 5B is electrically connected via the first layer of wiring 9 to the second layer of wiring 10 (Vcc). When the bonding pads 4B are used as reference voltage (GND) pads, the outgoing wiring 5B is electrically connected via the first layer of wiring 9 to the second layer of wiring 10 (GND), A description will subsequently be given of the sectional structure of the semiconductor chip 1 in an area where the outgoing wiring 5A, 5B is formed, by reference to FIG. 13 (sectional view of one end portion of the outgoing wiring 5A, 5B), FIG. 2(c) and FIG. 7(b).

The field insulating film 6 made of oxide silicon and used for element separation is formed on a semiconductor substrate 1A made of, for example, p-type single crystal silicon, and a oxide silicon film 14 is formed on the field insulating film 6. The oxide silicon film 14 is an insulating film for electrically separating the MISFETs that have not been formed in this area from the wiring thereon.

The first layer of wiring 9 and the wiring 9B are formed on the oxide silicon film 14. The first layer of wiring 9 in the central part of FIG. 13 forms one end portion of the signal wiring connected to the outgoing wiring 5A of the bonding pads 4A on the inner line side, and two layers of wiring 9B each on both sides of the wiring 9, form part of the outgoing wiring 5B connected to the bonding pads 4B on the outer line side. The first layer of wiring 9 and the wiring 9B are formed by, for example, patterning the Al alloy film deposited by the sputtering method on the oxide silicon film 14. The width and thickness of the first layer of wiring 9 with the wiring 9B are, for example, 20 μm, 0.5 μm.

The first layer-to-layer insulating film 15 is formed on the first layer of wiring 9 and the wiring 9B. The first layer-to-layer insulating film 15 is made of the oxide silicon deposited by the CVD method and its surface is made flat by, for example, the CMP (Chemical Mechanical Polishing) method. The first layer-to-layer insulating film 15 is formed on the whole main surface of the semiconductor substrate 1A in such a way as to cover the surface thereof.

The pad wiring 10A and the wiring 10B are formed on the first layer-to-layer insulating film 15. The pad wiring 10A is intermediate wiring for connecting the first layer of wiring 9 to the outgoing wiring 5A of the bonding pads 4 on the inner line side, and the wiring 10B forms the other part of the outgoing wiring 5B connected to the bonding pads 4B on the other line side. The pad wiring 10A and the wiring 10B are formed by, for example, patterning the Al alloy film deposited by the sputtering method on the first layer-to-layer insulating film 15. The pad wiring 10A and the wiring 10B are made as wide and thick as the first layer of wiring 9 and the wiring 9B thereunder.

The pad wiring 10A and the first layer of wiring 9 thereunder are electrically connected through a plurality of connection holes 12A bored in the first layer-to-layer insulating film 15. Similarly, the pad wiring 10B and the wiring 9B thereunder are electrically connected through a plurality of connection holes 12B bored in the first layer-to-layer insulating film 15. Plugs 16 of, for example, tungsten (W) are embedded inside the respective connection holes 12A, 12B. Each plug 16 is embedded by etching-back the W film deposited by the sputtering (or CVD) method on the first layer-to-layer insulating film 15.

The second layer-to-layer insulating film 17 is formed on the pad wiring 10A and the wiring 10B. Like the first layer-to-layer insulating film 15, the second layer-to-layer insulating film 17 is made of oxide silicon deposited by the CVD method and its surface is made flat by, for example, the CMP (Chemical Mechanical Polishing) method.

The outgoing wiring 5A, which is integral with the bonding pads 4A on the inner line side is formed on the second layer-to-layer insulating film 17. The outgoing wiring 5A is formed by, for example, patterning the Al alloy film deposited by the sputtering method on the second layer-to-layer insulating film 17. Although the outgoing wiring 5A is as wide (20 μm) as the wiring 9B, 10B constituting the outgoing wiring 5B, it is twice as thick as the latter.

When each of the two layers of wiring 9B, 10B constituting the outgoing wiring 5B is set to 0.5 μm in that case, the effective thickness of the outgoing wiring 5B becomes as follows: 0.5+0.5=1.0 μm. When, therefore, the thickness of the other outgoing wiring 5A is set to 1.0 μm, the effective thickness of the outgoing wiring SA becomes equal to that of the outgoing wiring 3B (i.e., 1.0 μm). Further, assuming that the two layers of outgoing wiring 5A, 5B (those of wiring 9B, 10B) are equal in width (20 μm) to each other, the effective sectional areas of the two outgoing wiring films 5A, 5B also become equalized (20 μm×1.0 μm=20 μm$^2$). Therefore, as shown in Table 1, the density of the current flowing through the outgoing wiring 5A becomes substantially equal to the density of the current flowing through the outgoing wiring 5B (wiring 9B, 10B).

TABLE 1

| Wiring layer | Wiring film thickness | Wiring density |
|---|---|---|
| Third layer of wiring (5B) | 1.0 (μm) | 20 (mA/μm) |
| Second layer of wiring (10B) | 0.5 (μm) | 10 (mA/μm) |
| First Layer of wiring (9B) | 0.5 (μm) | 10 (mA/μm) |

The outgoing wiring 5A and the pad wiring 10A thereunder are electrically connected through a plurality of connection holes 13A bored in the second layer-to-layer insulating film 17. Plugs 16 of, for example, tungsten (W) are embedded inside the respective connection holes 13A. Each plug 16 is embedded by etching-back the W film deposited by the sputtering (or CVD) method on the second layer-to-layer insulating film 17.

According to this embodiment of the invention, a so-called stacked via structure has been employed in which the connection holes 13A are placed right above the connection holes 12A for use in connecting the pad wiring 10A and the first layer of wiring 9 thereunder. The stacked via structure is built up by flattening the layer-to-layer film using the CMP method and embedding the W plug inside the connection hole.

A passivation film 19 is formed on the outgoing wiring 5 and is used as the surface protective film of the semiconductor chip 1 and is formed with a laminated film of oxide silicon and nitride silicon deposited by the CVD method.

Figure 14:
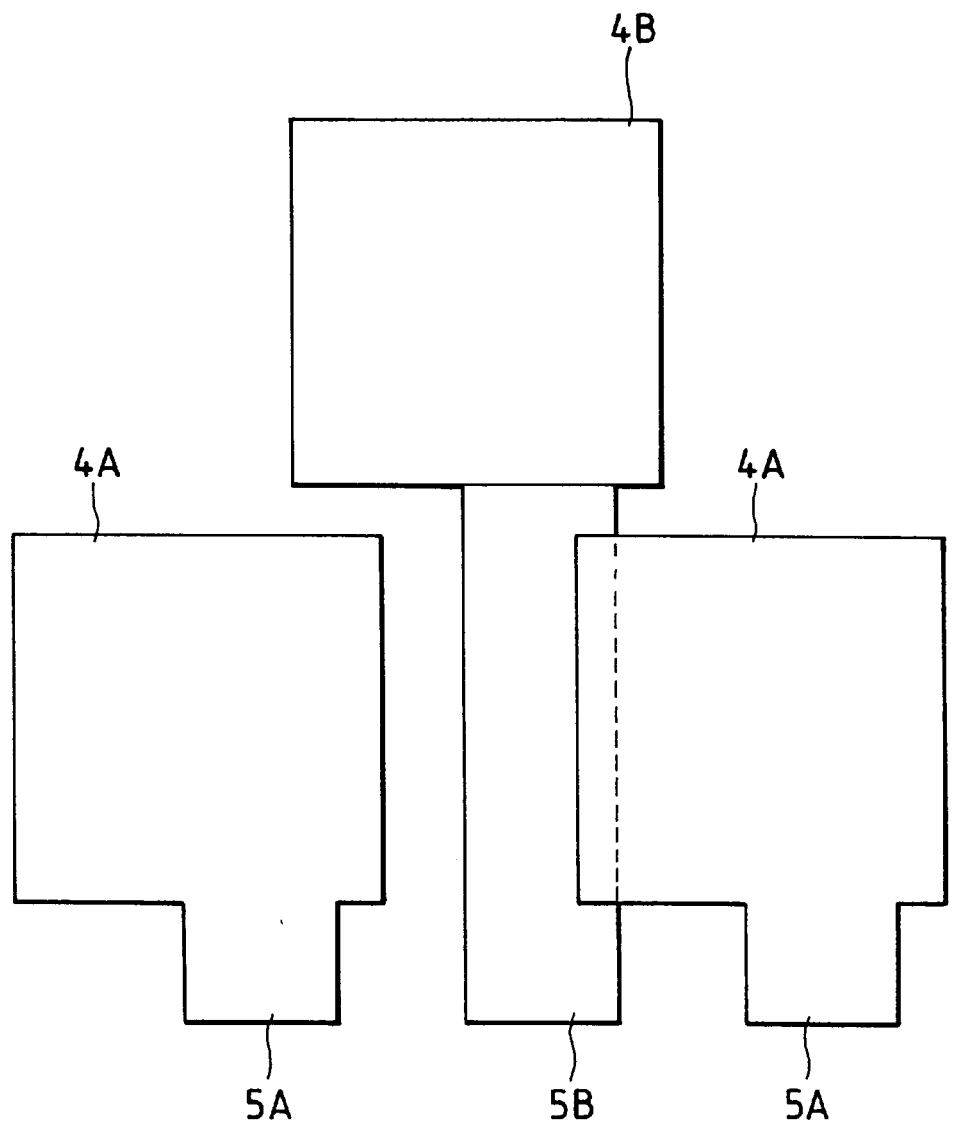
FIG. 14 is a plan view showing an exemplary arrangement of the outgoing wiring connecting the bonding pads and the outgoing wiring for connecting them in the semiconductor integrated circuit according to the first embodiment of the invention.

The CMOS gate array thus formed according to this embodiment of the invention has the following effect:

(1) The bonding pads 4A, 4B are arranged in a zigzag manner, and the outgoing wiring 5A of the bonding pads 4A on the inner line side and the outgoing wiring 5B of the bonding pads 4B on the outer line side are formed in a different layers of wiring, whereby even though the pitch of the bonding pads 4A, 4B is narrowed, the outgoing wiring 5B of the bonding pads 4B on the outer line side is prevented from coming into contact with the bonding pads 4A on the inner line side. Therefore, as shown in FIG. 14, it is possible to overlap the outgoing wiring 5B of the bonding pad 4B on the other line side with the bonding pad 4A on the inner line side.

Since the outgoing wiring 5A of the bonding pads 4A on the inner line side is formed in the third layer of wiring as the uppermost layer of wiring, electromigration resistance can be secured by increasing the film thickness even though its width is reduced, so that a large current can be made to flow therethrough. Moreover, since the outgoing wiring 5B of the bonding pads 4B on the outer line side is formed in the double layer of wiring 9B, 10B, electromigration resistance can be secured even though the width of the wiring 9B, 10B is reduced, so that a large current can be made to flow therethrough.

Thus, the width and pitch of the outgoing wiring 5A, 5B are reducible, and consequently the pitch of the bonding pads 4A, 4B can also be reduced. More bonding pads are formable in the semiconductor chip 1 of the same size, and therefore a large-scale, multi-pin (with more externals) CMOS gate array becomes attainable.

(2) Since the sectional area of the outgoing wiring film 5A formed in the third layer of wiring and the sectional area of the outgoing wiring film 5B formed in the second layer of wiring can be equalized, the density of the current flowing through the outgoing wiring 5A and that of the current flowing through the outgoing wiring 5B become substantially equal. In other words, the density of the current flowing through the outgoing wiring of the whole bonding pad arranged on the outer periphery of the semiconductor chip 1 can substantially be equalized. It is therefore possible, as described above, to allow such a large current to flow through the outgoing wiring of the whole bonding pad that a sufficient current density can be secured by increasing the thickness of the outgoing wiring 5A formed in the third layer of wiring and forming the outgoing wiring 5B with the second layer of wiring.

In consequence, bonding pads to be connected to the power supply (Vcc, GND) line and the signal line through which a large current flows are freely selectable, so that the freedom of logic design using the automatically-arranged wiring system is improved. In other words, since the time required for the automatically-arranged wiring using CAD can be shortened, a period of developing a gate array is also shortened. Since the length of wiring for connecting the logic circuit and bonding pads can be shortened, wiring delay is reduced, so that high-speed, a high-performance gate array becomes attainable.

(Embodiment 2)

A semiconductor integrated circuit according to this embodiment of the invention is formed of a CMOS gate array having a five-layer wiring structure, and, as in Embodiment 1, the bonding pads 4A, 4B are arranged in a zigzag manner, and the outgoing wiring 5A of the bonding pads 4A on the inner line side and the outgoing wiring 5B of the bonding pads 4B on the outer line side are formed in different layers of wiring.

According to this embodiment of the invention, the outgoing wiring of the bonding pads 4A on the inner line side is formed in a double layer, namely, a fifth and a fourth layer of wiring, whereas the outgoing wiring of the bonding pads 4B on the outer line side is formed in a triple layer, namely, a third, a second and a first layer of wiring. Moreover, the bonding pads 4A, 4B are formed in the fifth layer of wiring.

Figure 15:
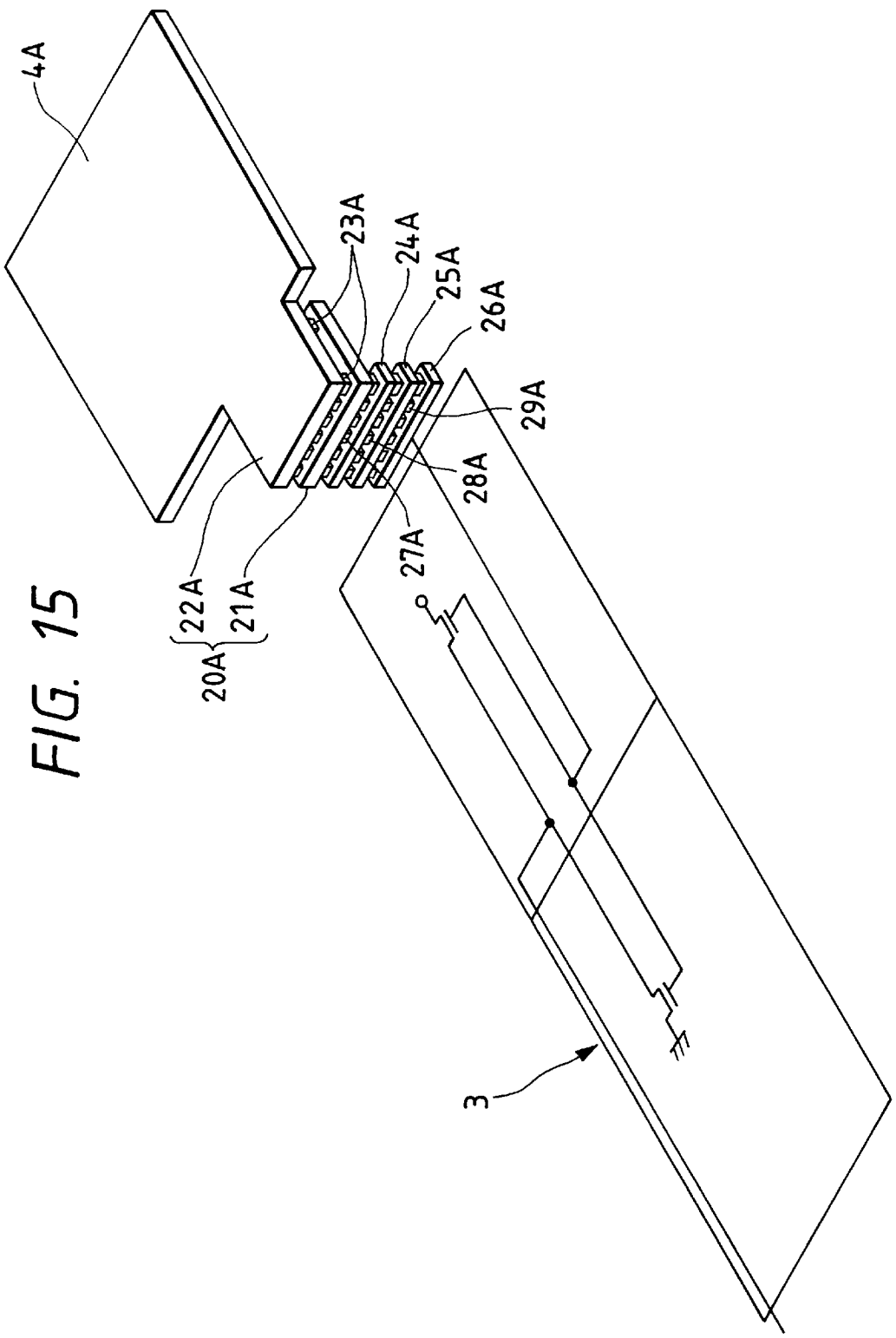
FIG. 15 is a perspective view showing a bonding pad on the inner line side, the input/output buffer circuit and outgoing wiring for connecting them in a semiconductor integrated circuit according to a second embodiment of the invention.
Figure 16:
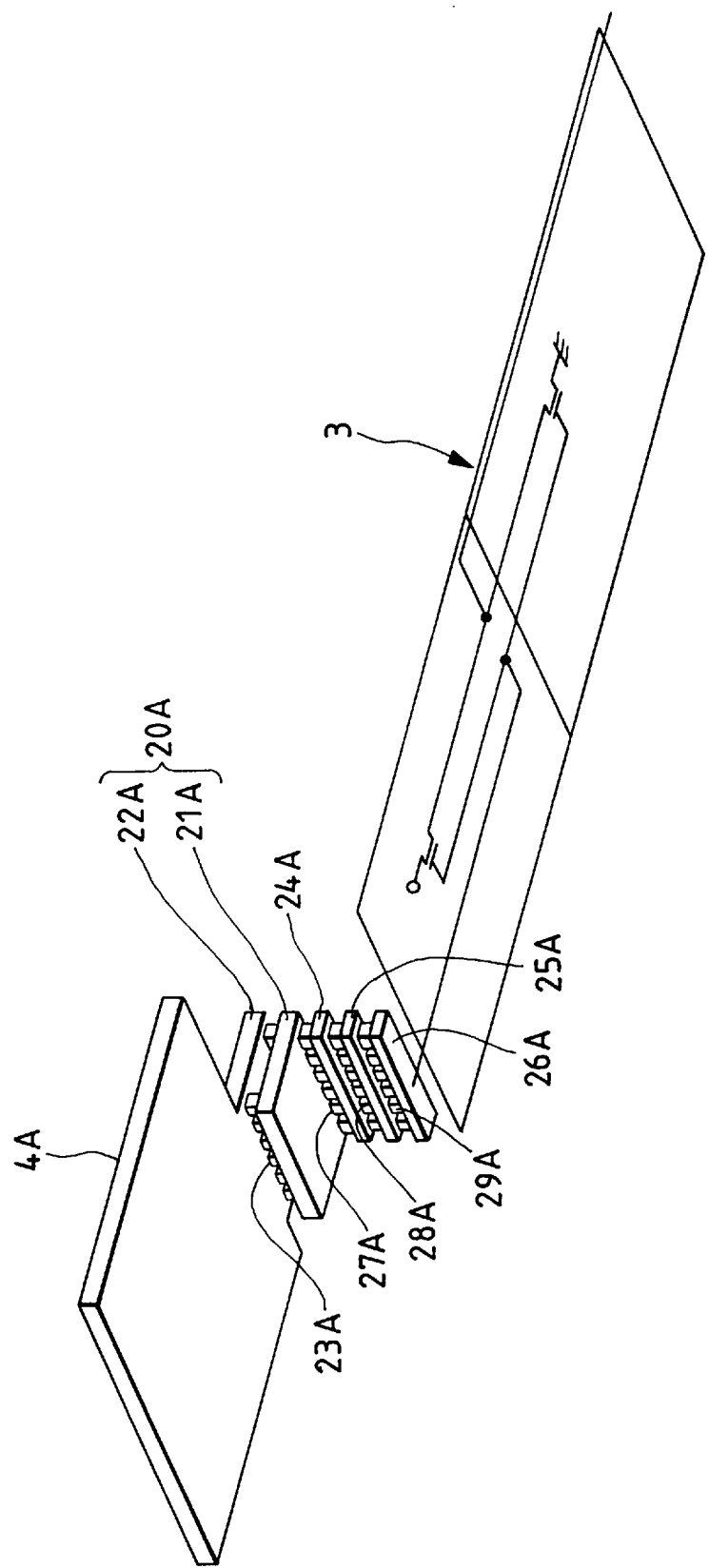
FIG. 16 is a perspective view showing the bonding pad on the inner line side, the input/output buffer circuit and outgoing wiring for connecting them in the semiconductor integrated circuit according to the second embodiment of the invention.

FIGS. 15–16 are perspective views showing the bonding pad 4A on the inner line side, the input/output buffer circuit 3 and outgoing wiring 20A for connecting them.

Of two layers of wiring 21A, 22A constituting the outgoing wiring 20A, the wiring 22A serving as the fifth layer of wiring is made integral with the bonding pad 4A. The wiring 21A serving as the fourth layer of wiring is formed with the same pattern as that of the wiring 22A and is superposed on the wiring 22A. Both end portions of the wiring 22A and the wiring 21A are electrically connected together through connection holes 23A.

The wiring 21A is connected to the input/output buffer circuit 3 via pad wiring 24A serving as the third layer of wiring, pad wiring 25A serving as the second layer of wiring and pad wiring 26A serving as the first layer of wiring. The wiring 21A and pad wiring 24A, the pad wiring 24A and the pad wiring 25A, and the pad wiring 25A and the pad wiring 26A, are electrically connected through connection holes 27A, 28A, 29A, respectively.

Figure 17:
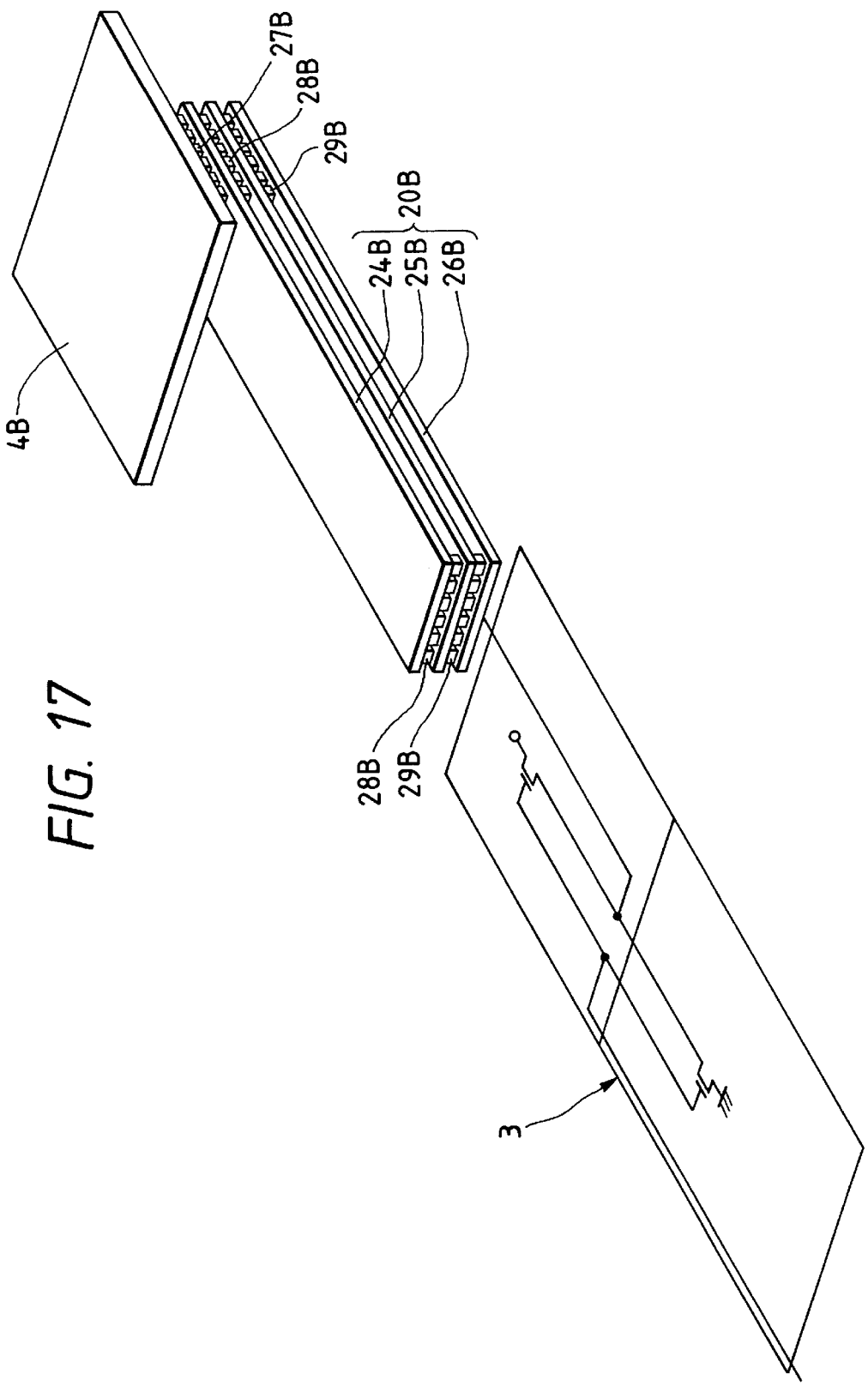
FIG. 17 is a perspective view showing the bonding pad on the outer line side, the input/output buffer circuit and outgoing wiring for connecting them in the semiconductor integrated circuit according to the second embodiment of the invention.
Figure 18:
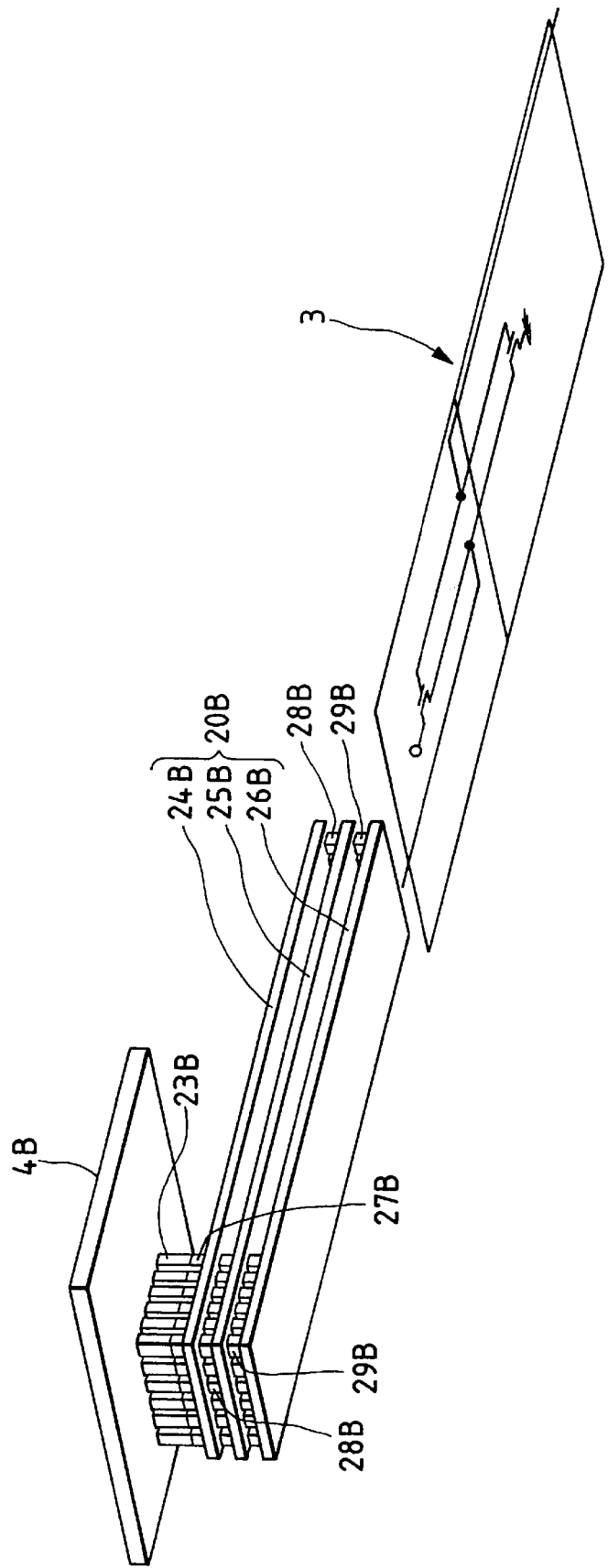
FIG. 18 is a perspective view showing the bonding pad on the outer line side, the input/output buffer circuit and outgoing wiring for connecting them in the semiconductor integrated circuit according to the second embodiment of the invention.

FIGS. 17–18 are perspective views showing the bonding pad 4A on the inner line side, the input/output buffer circuit 3 and outgoing wiring 20B for connecting them.

Three layers of wiring 24A, 25B and 26B constituting the outgoing wiring 20B are formed with the same pattern and are superposed. Both ends of the wiring 24B serving as the third layer of wiring, the wiring 25B serving as the second layer of wiring and the wiring 26B serving as the wiring 25B and the first layer of wiring are electrically connected together through connection holes 28B, 29B, respectively. Moreover, the bonding pads 4B and the outgoing wiring 20B serving as the fifth layer of wiring are electrically connected through connection holes 23B, 27B beneath the bonding pads 4B, respectively.

Figure 19:
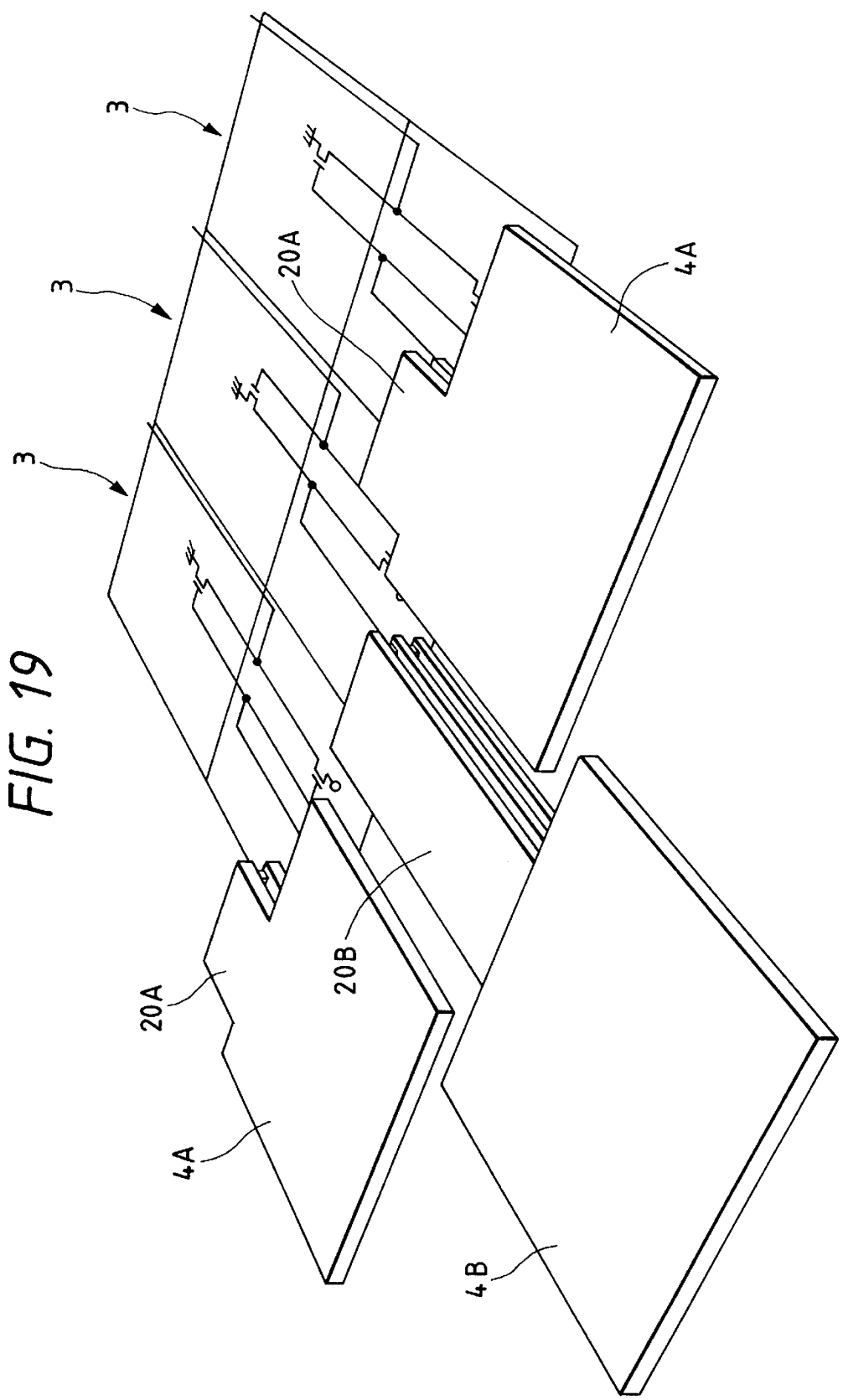
FIG. 19 is a perspective view showing the bonding pads on the outer line side, the input/output buffer circuits and outgoing wiring for connecting them in the semiconductor integrated circuit according to the second embodiment of the invention.
Figure 20:
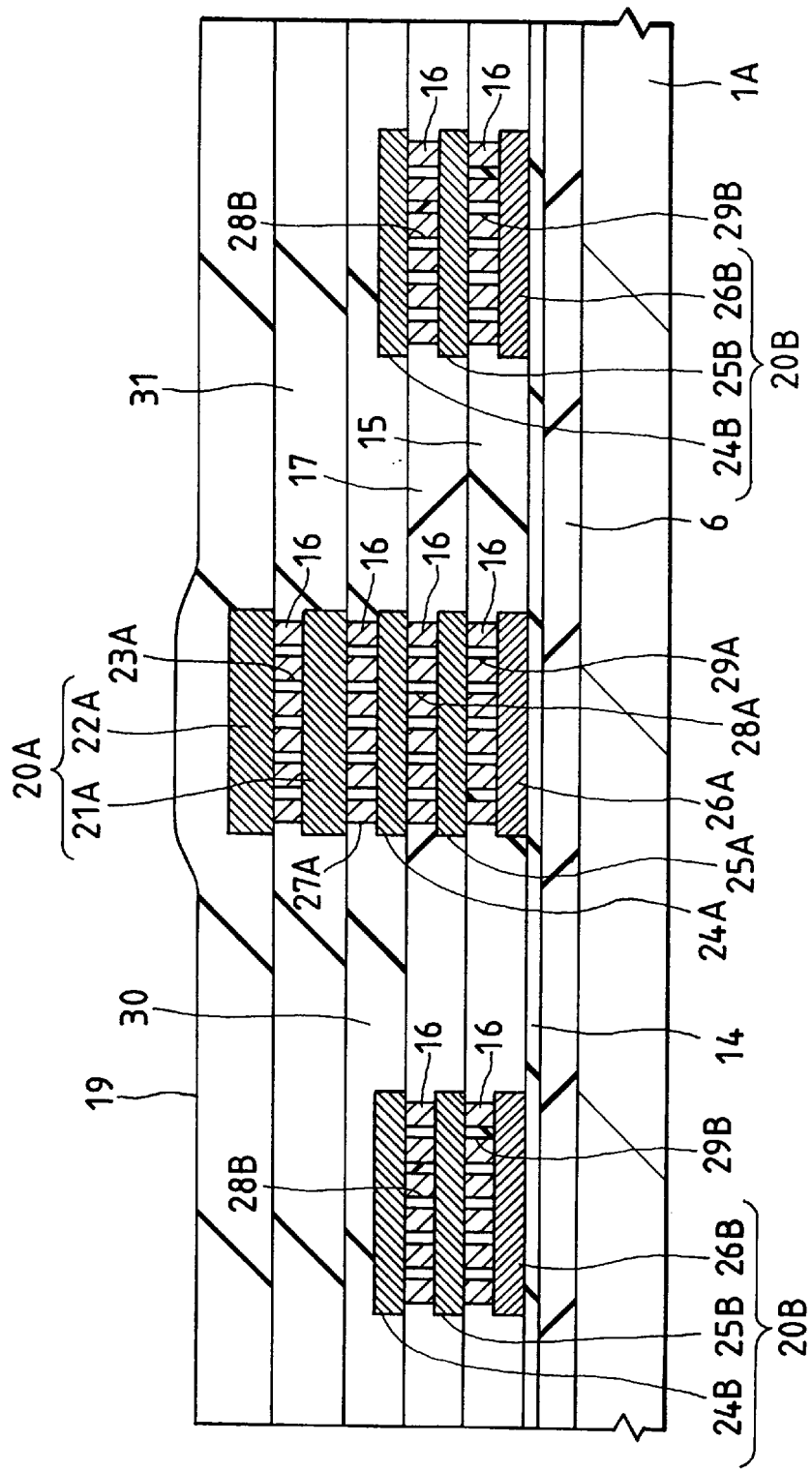
FIG. 20 is a sectional view showing the structure of the outgoing wiring in the semiconductor integrated circuit according to the second embodiment of the invention.
Figure 21:
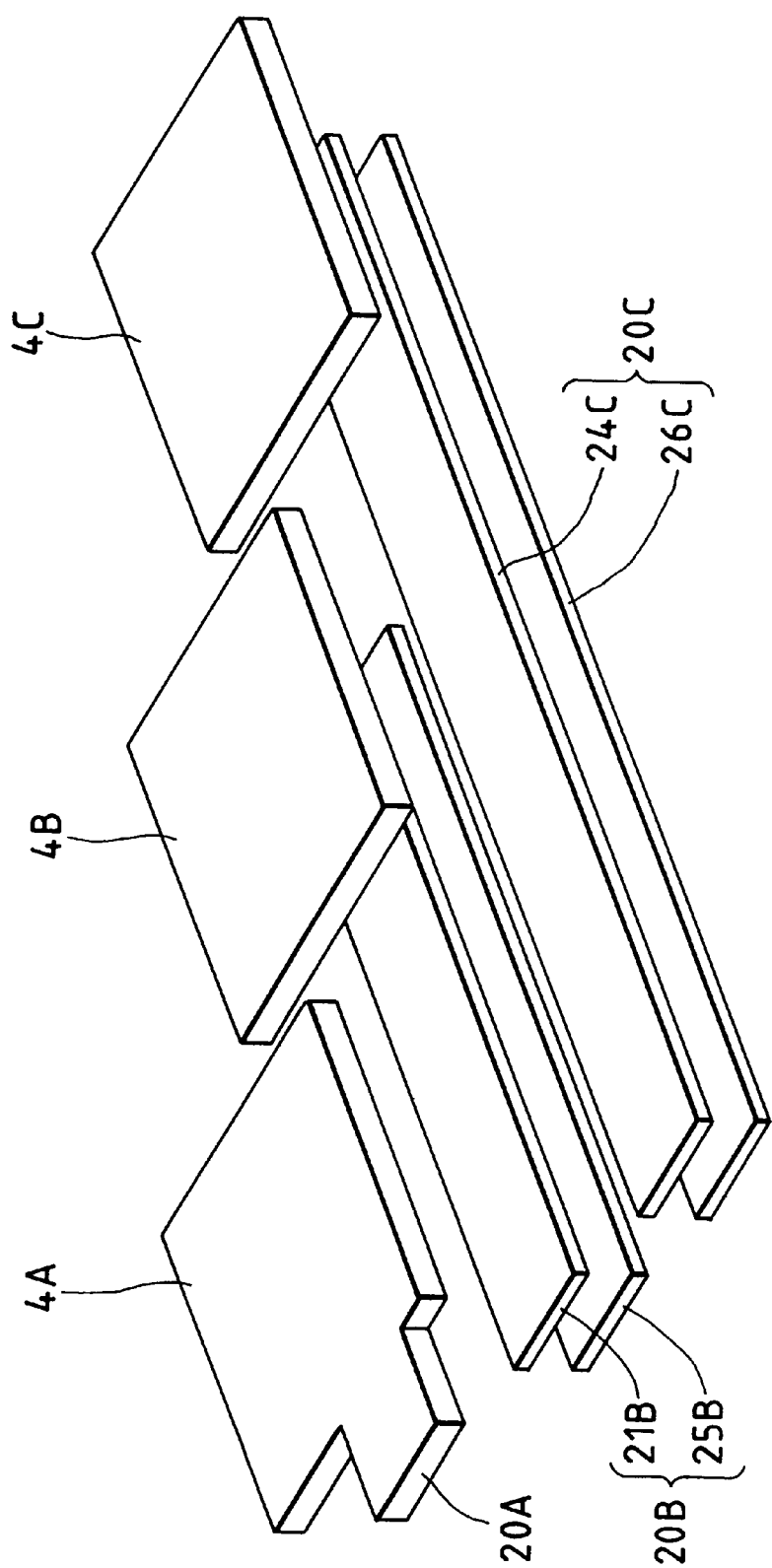
FIG. 21 is a perspective view showing bonding pads and outgoing wiring in the semiconductor integrated circuit according to another embodiment of the invention.

FIG. 19 shows an arrangement of three sets of input/output buffer circuits 3, outgoing wiring 20A, 20B and bonding pads 4A, 4B. FIG. 20 shows a sectional structure of the outgoing wiring 20A, 20B in one end portion on the side of the input/output buffer circuit 3. In FIG. 20, reference numeral 30 denotes a third layer-to-layer insulating film; and 31 denotes a fourth layer-to-layer insulating film. The third layer-to-layer insulating film 30 and the fourth layer-to-layer insulating film 31 are made of the oxide silicon deposited by, for example, the CVD method and the surfaces of them are flattened by, for example, the CMP method. Plugs 16 of, for example, W are embedded inside the connection holes 27A, 27B bored in the third layer-to-layer insulating film 30 and the connection holes 23A, 23B bored in the fourth layer-to-layer insulating film 31.

When the thickness of the three layers of wiring 24B, 25B, 26B constituting the outgoing wiring 20B is set to 0.4 $\mu$m in that case, the effective thickness of the outgoing wiring 20B becomes 0.4+0.4+0.4=1.2 $\mu$m. Assuming that the thickness of the two layers of wiring 21A, 22A constituting the other outgoing wiring 20A is 0.6 $\mu$m then, the effective thickness of the outgoing wiring 20A becomes 0.6+0.6=1.2 $\mu$m, so that the effective thickness of the outgoing wiring 20A (wiring 21A, 22A) becomes equal to that of outgoing wiring 20B (wiring 24B, 25B, 26B). Assuming the width of the outgoing wiring 20A is equal to that of the outgoing wiring 20B, further, the effective sectional area of the outgoing wiring film 20A and that of the outgoing wiring 20B are also equalized. Therefore, as shown in Table 2, the density of the current flowing through the outgoing wiring 25 becomes substantially equal to that of the current flowing through the outgoing wiring 25A.

TABLE 2

| Wiring layer | Wiring film thickness | Wiring density |
|---|---|---|
| Fifth layer of wiring (22A) | 0.6 ($\mu$m) | 12 (mA/$\mu$m) |
| Fourth layer of wiring (21A) | 0.6 ($\mu$m) | 12 (mA/$\mu$m) |
| Third layer of wiring (24B) | 0.4 ($\mu$m) | 8 (mA/$\mu$m) |
| Second layer of wiring (25B) | 0.4 ($\mu$m) | 8 (mA/$\mu$m) |
| First layer of wiring (26B) | 0.4 ($\mu$m) | 8 (mA/$\mu$m) |

Substantially the same effect as that in the preceding embodiment of the invention is obtainable from the CMOS gate array arranged as shown in Table 2 according to this embodiment thereof.

(Embodiment 3)

A semiconductor integrated circuit according to this embodiment of the invention is substantially similar to what has been described in Embodiment 2 except that the outgoing wiring of the bonding pads 4A on the inner line side is formed of only the fourth layer of wiring.

Figure 23:
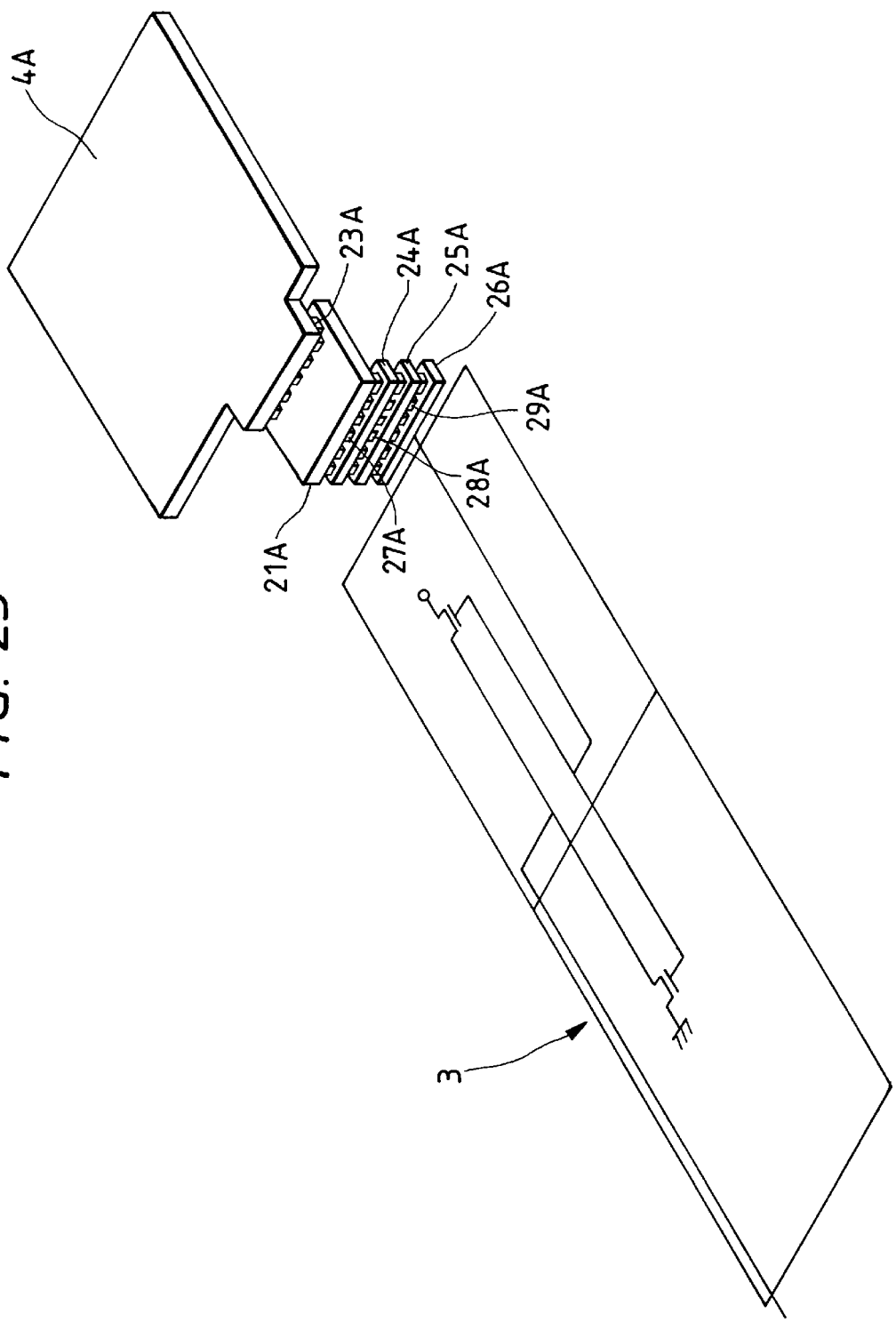
FIG. 23 is a perspective view showing the bonding pad and the outgoing wiring in the semiconductor integrated circuit according to the other embodiment of the invention.

FIG. 23 is a perspective view showing the bonding pad 4A on the inner line side, the input/output buffer circuit 3 and the wiring 21 for connecting them.

The outgoing wiring 21A is formed in the fourth layer of wiring and is electrically connected through connection holes 23A to the bonding pad 4A formed in the fifth layer of wiring.

The wiring 21A is connected to the input/output buffer circuit 3 via the pad wiring 24A serving as the third layer of wiring, the pad wiring 25A serving as the second layer of wiring and the pad wiring 26A serving as the first layer of wiring. The wiring 21A and the pad wiring 24A, the pad wiring 24A and the pad wiring 25A, and the pad wiring 25A and the pad wiring 26A, are electrically connected through the connection holes 27A, 28A, 29A, respectively.

The bonding pads 4B on the outer line side, the input/output buffer circuit 3 and the outgoing wiring 20B for connecting them are, as shown in FIGS. 17–18, arranged as in Embodiment 2.

According to this embodiment of the invention, it has been arranged that the effective sectional area of the outgoing wiring film 21A becomes substantially equal to that of the outgoing wiring 20B.

Thus substantially the same effect as that of Embodiment 2 of the invention is obtainable from the CMOS gate array arranged as described above according to this embodiment thereof.

Although a detailed description has been given of the embodiments of the present invention, the invention is not limited to the embodiments described above, but may be modified in various manners without departing from the spirit and scope thereof.

Although a description has been given of a gate array having a three-layer wiring structure and one that has a five-layer wiring structure in the preceding embodiments, the present invention may also be applicable to any gate array having a four-layer wiring structure or a structure of more than five layers of wiring.

In the case of four layers of wiring, the fourth layer of wiring and the second layer of wiring, for example, are used to form the first outgoing wiring to be connected to the bonding pads on the inner line side, whereas the third layer of wiring and the first layer of wiring, for example, are used to form the second outgoing wiring to be connected to the bonding pads on the outer line side. Assuming that the first outgoing wiring is as wide as the second outgoing wiring at that time, the fourth layer of wiring is made equal in thickness to the third layer of wiring, and the second layer of wiring is also made equal in thickness to the first layer of wiring, whereby the density of the current flowing through the first outgoing wiring becomes substantially equal to that of the current flowing through the second outgoing wiring. In the case of more than five layers of wiring, it is possible to devise a number of combinations of wiring layers for the first outgoing wiring and the second outgoing wiring.

Although a description has been given of a case where two lines of bonding pads are arranged in the preceding embodiments, the present invention is also applicable to an arrangement of bonding pads in three lines. In the case of five layers of wiring, for example, an arrangement may be made so as to form the outgoing wiring 20A of the bonding pads 4A on the innermost line side integrally with the bonding pads 4A (the fifth layer of wiring), to form the outgoing wiring 20B of the bonding pads 4B on the central line side in the fourth layer of wiring (wiring 21B) and the second layer of wiring (wiring 25B), and also the outgoing wiring 20C of the bonding pads 4C on the outermost line side in the third layer of wiring (wiring 24C) and the first layer of wiring (wiring 26C).

Although a description has been given of a CMOS gate array in the preceding embodiments, the present invention is also applicable to ICs for special use, such as an embedded array, a cell base IC and the like. The present invention is applicable to a multipin LSI having at least more than two layers of wiring and bonding pads arranged in a zigzag manner.

The effect of the invention achievable by the preferred embodiments thereof as disclosed in the present specification will subsequently be described.

(1) Since the width and pitch of the outgoing wiring for connecting the bonding pads and the internal circuits can be narrowed according to the present invention, the pitch of the bonding pads can also be narrowed. Consequently, more bonding pads are formable in a semiconductor chip of the same size, whereby a large-scale CMOS gate array having a greater number of external terminals is attainable.

(2) Since the density of the current flowing through the outgoing wiring of the whole bonding pad arranged on the outer periphery of the semiconductor chip can substantially be equalized according to the present invention, and since a large current can be made to flow through the outgoing wiring of the whole bonding pad, bonding pads to be connected to the power supply line (Vcc, GND) and the signal line through which a large current flows are freely selectable, and the freedom of logic design using the automatically-arranged wiring system is improved as well.

What is claimed is:

1. A semiconductor integrated circuit device having three or more wiring layers, comprising:

a plurality of bonding pads arranged in a zigzag manner along an outer peripheral portion of a semiconductor substrate;

a plurality of input/output buffer circuits;

wherein said bonding pads comprise bonding pads on an inner line side and bonding pads on an outer line side, wherein said bonding pads on said inner line side are arranged between said bonding pads on said outer line side and said input/output buffer circuits;

a first outgoing wiring comprised of an uppermost wiring layer; and a second outgoing wiring comprised of a plurality of wiring layers other than the uppermost wiring layer in which said first outgoing wiring is formed, wherein said second outgoing wiring includes a wiring layer having a sectional area lower than a sectional area of said uppermost wiring layer, wherein said first outgoing wiring is electrically connected between said bonding pads on said inner line side and said input/output buffer circuits, and wherein said second outgoing wiring is electrically connected between said bonding pads on said outer line side and said input/output buffer circuits.

2. A semiconductor integrated circuit device according to claim 1, wherein said wiring layer is comprised of a five-layer structure of first to fifth wiring layers with the uppermost layer being the fifth wiring layer, wherein said first outgoing wiring is comprised of the uppermost fifth wiring layer and the fourth wiring layer, wherein said second outgoing wiring is comprised of the third wiring layer, the second wiring layer and the first wiring layer, and wherein said fifth and fourth wiring layers are higher level layers than said third, second and first wiring layers.

3. A semiconductor integrated circuit device having three or more wiring layers, comprising:

a plurality of bonding pads arranged in a zigzag manner along an outer peripheral portion of a semiconductor substrate;

a plurality of input/output buffer circuits arranged along said outer peripheral portion of said semiconductor substrate, wherein said bonding pads comprise bonding pads on an inner line side and bonding pads on an outer line side, wherein said bonding pads on said inner line side are arranged between said bonding pads on said outer line side and said input/output buffer circuits;

a power supply wiring formed over said input/output buffer circuits along said outer peripheral portion of said semiconductor substrate and electrically connected to said input/output buffer circuits;

a first outgoing wiring comprised of an uppermost wiring layer; and a second outgoing wiring comprised of a plurality of wiring layers other than the uppermost wiring layer in which said first outgoing wiring is formed, wherein said first outgoing wiring is electrically connected between said bonding pads on said inner line side and said input/output buffer circuits, wherein said second outgoing wiring is electrically connected between said bonding pads on said outer line side and said input/output buffer circuits, and wherein said second outgoing wiring includes the same level wiring layer as said power supply wiring.

4. A semiconductor integrated circuit device according to claim 3, wherein said first and second outgoing wiring extend in a direction perpendicular to direction in which said power supply wiring extends.

5. A semiconductor integrated circuit device according to claim 3, wherein said bonding pads on said inner and said outer line side are comprised of said uppermost wiring layer.

6. A semiconductor integrated circuit device according to claim 1, wherein said bonding pads on said inner and said outer line sides are comprised of said uppermost wiring layer.

7. A semiconductor integrated circuit device according to claim 3, wherein said input/output buffer circuit includes MISFETs electrically connected therebetween by a first wiring layer, wherein said power supply wiring is comprised of a wiring layer higher than said first wiring layer.

8. A semiconductor integrated circuit device according to claim 3, wherein said input/output buffer circuits surround a logic circuit portion formed at a central portion of said semiconductor substrate, wherein said power supply wiring is formed over said input/output buffer circuits to surround said logic circuit portion.

* * * * *